(12) United States Patent
Tsai et al.

(10) Patent No.: US 12,119,428 B2
(45) Date of Patent: Oct. 15, 2024

(54) LIGHT-EMITTING ASSEMBLY, METHOD FOR MAKING SAME, AND ELECTRONIC DEVICE USING SAME

(71) Applicants: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

(72) Inventors: Han-Lung Tsai, Hsinchu (TW); I-Chang Kuan, Zhunan (TW); Ten-Hsing Jaw, Zhubei (TW)

(73) Assignees: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

( * ) Notice: Subject to any disclaimer, the term of this patent is extended or adjusted under 35 U.S.C. 154(b) by 201 days.

(21) Appl. No.: 17/327,208

(22) Filed: May 21, 2021

(65) Prior Publication Data
US 2022/0029062 A1 Jan. 27, 2022

(30) Foreign Application Priority Data
Jul. 24, 2020 (CN) .................. 202010723138.X

(51) Int. Cl.
*G06F 3/041* (2006.01)
*H01L 33/00* (2010.01)
(Continued)

(52) U.S. Cl.
CPC .............. *H01L 33/46* (2013.01); *G06F 3/041* (2013.01); *H01L 33/005* (2013.01); *H01L 33/60* (2013.01);
(Continued)

(58) Field of Classification Search
CPC ....................................................... G06F 3/041
(Continued)

(56) References Cited

U.S. PATENT DOCUMENTS 10,715,140 B2 * 7/2020 Gipson ................ G02B 6/0083
2009/0295948 A1 12/2009 Oishi
(Continued)

FOREIGN PATENT DOCUMENTS

CN 111082795 A * 4/2020 ............. G06F 3/044
DE 102016218538 A1 3/2018
(Continued)

*Primary Examiner* — Hsin Yi Hsieh
(74) *Attorney, Agent, or Firm* — ScienBiziP, P.C.

(57) ABSTRACT

A light-emitting assembly with improved illumination includes a first substrate, a light guide layer, light emitters, a touch sensor, a first reflective layer, and a second reflective layer. The first substrate defines a light-transmitting area. The light emitters are in the light guide layer. The light emitters emit light to illuminate the light-transmitting area. The touch sensor is opposite to the light-transmitting area. The first reflective layer is between the first substrate and the light guide layer and defines an opening aligned with the light-transmitting area. The second reflective layer is on a side of the light guide layer away from the first substrate. An electronic device using the light-emitting assembly and a method for making the light-emitting assembly are also disclosed.

11 Claims, 23 Drawing Sheets

(51) Int. Cl.
　　　*H01L 33/46*　　　(2010.01)
　　　*H01L 33/60*　　　(2010.01)
(52) U.S. Cl.
　　　CPC .............. *G06F 2203/04107* (2013.01); *H01L 2933/0025* (2013.01); *H01L 2933/0058* (2013.01)
(58) Field of Classification Search
　　　USPC .......................................................... 257/98
　　　See application file for complete search history.

(56) References Cited

U.S. PATENT DOCUMENTS

| | | |
|---|---|---|
| 2011/0304484 A1 | 12/2011 | Lee et al. |
| 2015/0225862 A1 | 8/2015 | Zenitani et al. |
| 2021/0345490 A1* | 11/2021 | Jaw .................... H05K 3/284 |

FOREIGN PATENT DOCUMENTS

| | | |
|---|---|---|
| EP | 2085702 A2 | 8/2009 |
| JP | 2018088557 A | 6/2018 |
| WO | 2009/004740 A1 | 1/2009 |

\* cited by examiner

LIGHT-EMITTING ASSEMBLY, METHOD FOR MAKING SAME, AND ELECTRONIC DEVICE USING SAME

FIELD

The subject matter herein generally relates to displays, specifically a light-emitting assembly, a method for making the light-emitting assembly, and an electronic device using the light-emitting assembly.

BACKGROUND

Generally, a light-emitting assembly includes a substrate defining a light-transmitting area and light-emitting elements (e.g., LEDs) under the substrate and surround the light-transmitting area. The light-emitting elements project light to illuminate the light-transmitting area. However, the light-emitting elements are suspended in air, the light emitted by the light-emitting elements is dispersed and lost all around, so that the light emitted by the light-emitting elements cannot completely cover the light-transmitting area.

Therefore, there is room for improvement in the art.

BRIEF DESCRIPTION OF THE DRAWINGS

Implementations of the present disclosure will now be described, by way of embodiments, with reference to the attached figures.

DETAILED DESCRIPTION

Figure 1A:
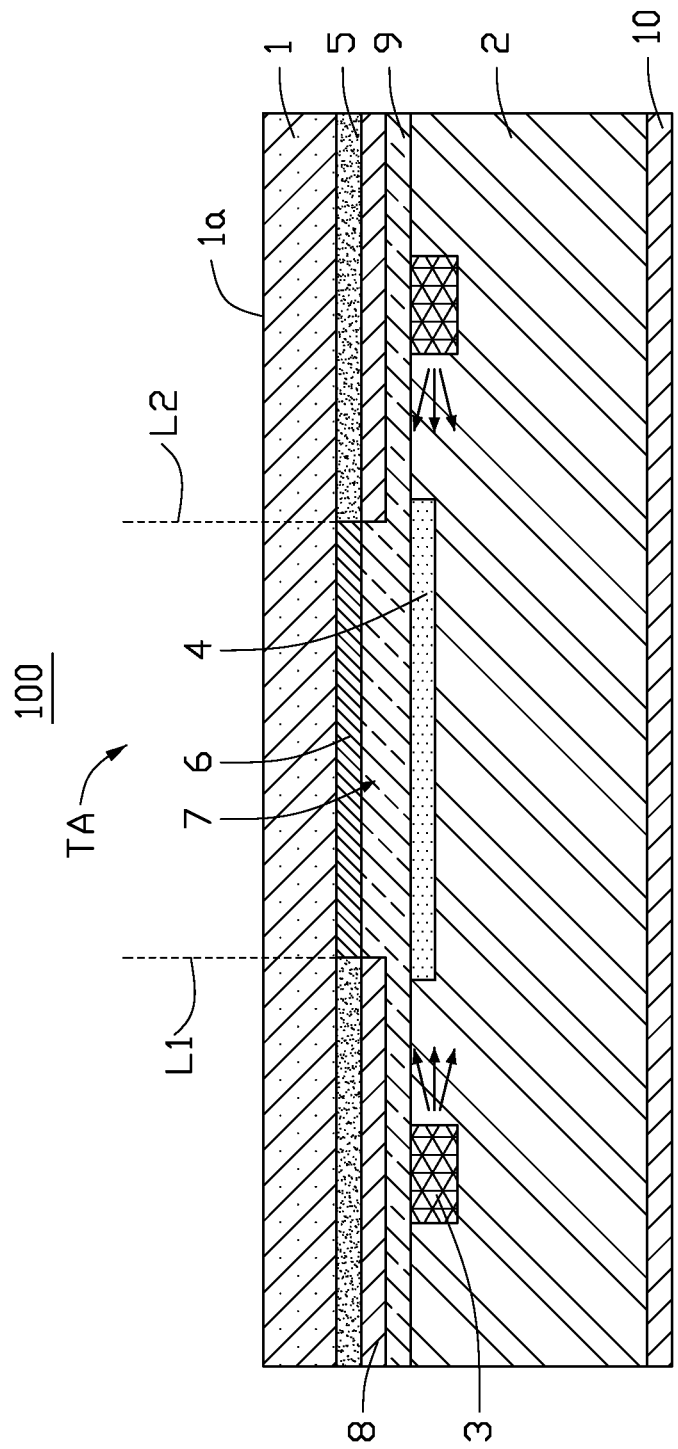
FIG. 1A is a cross-sectional view of a light-emitting assembly according to a first embodiment of the present disclosure.

It will be appreciated that for simplicity and clarity of illustration, where appropriate, reference numerals have been repeated among the different figures to indicate corresponding or analogous elements. In addition, numerous specific details are set forth to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one".

First Embodiment

FIG. 1A shows a light-emitting assembly 100 according to the first embodiment. The light emitting assembly 100 includes a first substrate 1, a light guide layer 2, a plurality of light emitters 3, a touch sensor 4, a light-shielding layer 5, a first reflective layer 8 and a second reflective layer 10. The first substrate 1 is made of a light-transmitting material. The first substrate 1 defines a light-transmitting area TA to allow light to pass through. The actual position of the light-transmitting area TA is an area of the first substrate 1, and dotted lines L1 and L2 in FIG. 1A where a partial boundary of the light-transmitting area TA is shown. The first substrate 1 defines a first surface 1a configured for receiving touches. That is, the first surface 111 is a pressure-sensitive interface, which can be pressed by a user. The light guide layer 2 is a side of the first substrate 1 away from the first surface 1a. The light emitters 3 are in the light guide layer 2. The light emitters 3 project light to pass through and illuminate the light-transmitting area TA. The first reflective layer 8 is between the first substrate 1 and the light guide layer 2. The first reflective layer 8 defines an opening 7 aligned with the light-transmitting area TA. The light-shielding layer 5 is between the first substrate 1 and the first reflective layer 8. The light-shielding layer 5 includes a hole 6 facing the light-transmitting area TA. The hole 6 is aligned with and in communicating with the opening 7 to define a passage for the light emitted by the light emitters 3. The second reflective layer 10 is on a side of the light guide layer 2 away from the first substrate 1. A shape of the hole 6 defines a function icon associated with a function. The light emitters 3 project light to illuminate the function icon. The function icon may be a symbol that refers to a certain function.

The touch sensor 4 is in the light guide layer 2 and opposite to the light-transmitting area TA. When the first substrate 1 is pressed, the touch sensor 4 can sense whether there is an external force to touch the first surface 1a of the first substrate 1. The hole 6, the opening 7 and the light-transmitting area TA are aligned with each other, and the light emitted by the light emitters 3 passes through the opening 7, the hole 6 and the light-transmitting area TA and leaves the light-emitting assembly 100. Thus, the light emitted by the light emitters 3 passes through the light-transmitting area TA to indicate and guide the user to press the position of the first surface 111 of the first substrate 11 corresponding to the touch sensor 4. Thereby, when the pressing force is greater than a specific value, the function associated with the function icon is executed. In other embodiments, the light emitters 3 can be activated after the user presses the light-transmitting area TA, and the emitted light, illuminating the light-transmitting area TA, can indicate a successful press. The light-emitting assembly 100 can be a button.

In one embodiment, a material of the first substrate 1 may be, but is not limited to, polymethyl methacrylate (PMMA), polycarbonate (PC), polyimide (PI), Copolymer of methyl methacrylate and styrene, polyethylene terephthalate (PET), or glass.

In one embodiment, each light emitter 3 is a side-emitting light-emitting diode (LED). The arrow in FIG. 1A shows the direction of light emitted by the LED.

In one embodiment, the first reflective layer 8 is made of metal. The light-emitting assembly 100 further includes a transparent insulating layer 9 between the first reflective layer 8 and the light guide layer 2. The transparent insulating layer 9 covers the first reflective layer 8 and may fill the opening 7 or fill both the opening 7 and the hole 6. The light emitters 3 and the touch sensor 4 are on a side of the transparent insulating layer 9 away from the first substrate 1 and covered by the light guide layer 2.

In one embodiment, the first substrate 1 is transparent, the light-shielding layer 5 is opaque. The opening 6 corresponding to the light-transmitting area TA is filled with transparent material. For example, the light shielding layer 5 is an opaque ink formed on the first substrate 1 through a process such as printing or coating. The hole 6 is filled with the same transparent material as the first substrate 1 or printed with transparent ink of colors (for example, red, green, and blue), or filled with a transparent insulating layer 9, or filled with air. A material of the light-shielding layer 5 is opaque ink.

In one embodiment, the light-emitting assembly further includes traces (not shown) on the transparent insulating layer 9 and embedded in the light guide layer 2. The light emitters 3 can be, but are not limited to, electrically connected to a flexible circuit board (FPC) by the traces.

In one embodiment, the light guide layer 2 is configured to guide the light emitted by the light emitters 3 and is made of resin. For example, a material of the light guide layer 2 may be, but is not limited to, PMMA, PS, PC, or Diallyl 2,2'-oxydiethyl dicarbonate (CAS). The light emitters 3 are in the light guide layer 2 instead of being suspended in air. Thereby, the light emitted by the light emitters 3 is not dispersed and lost all around, a thickness of the light-emitting assembly is reduced. The light emitted by the light emitters 3 passes through the light guide layer 2, reaches the first reflective layer 8 or the second reflective layer 10, and is reflected by the first reflective layer 8 or the second reflective layer 10. Thereby, the propagation direction of the light emitted by the light emitters 3 is changed, so that more of the light emitted by the light emitters 3 can pass through the light-transmitting area TA defined by the hole 6, and a light emitting range of the light-emitting assembly 100 is expanded.

Second Embodiment

Figure 2A:
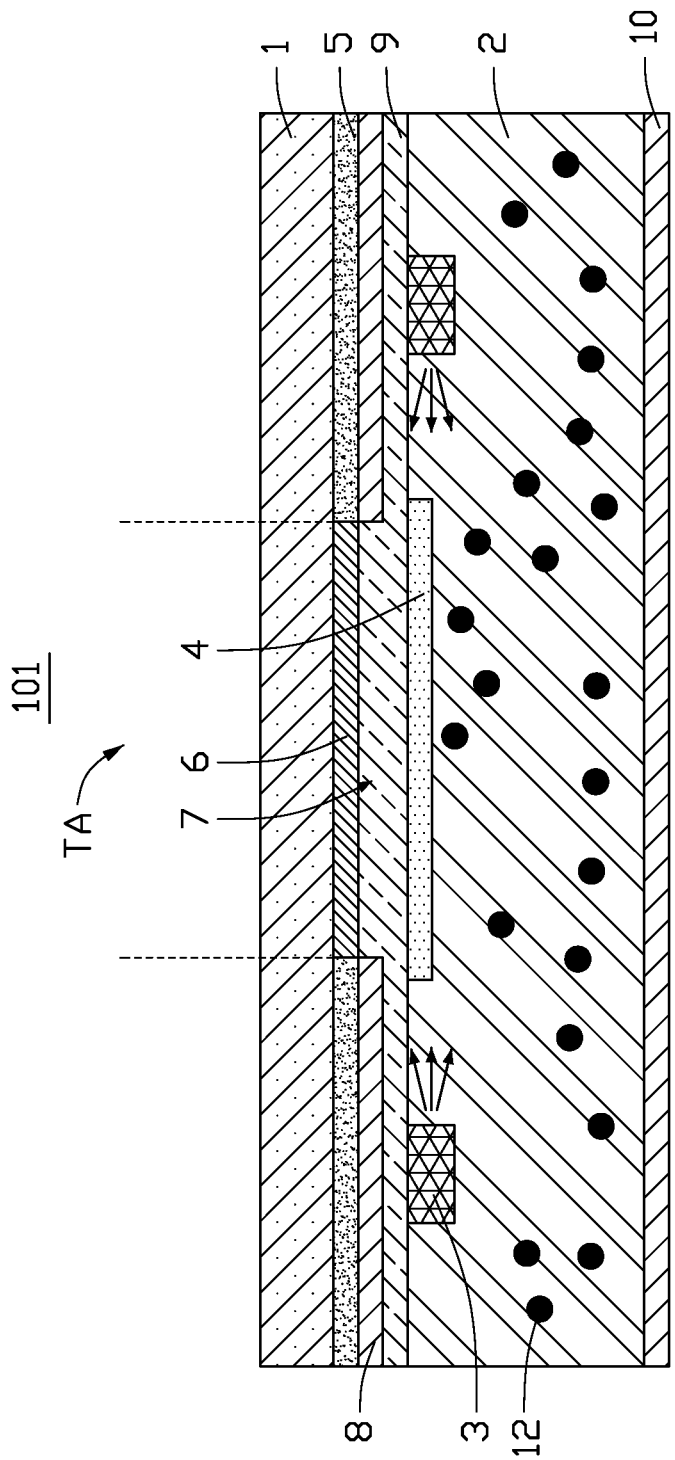
FIG. 2A is a cross-sectional view of a light-emitting assembly according to a second embodiment of the present disclosure.

FIG. 2A shows a light-emitting assembly 101 according to a second embodiment. The difference between the light-emitting assembly 101 and the light-emitting assembly 100 is that the light-emitting assembly 101 further includes diffusion particles 12 distributed in the light guide layer 2. In one embodiment, the diameter of each diffusion particle 12 is greater than or equal to 2 µm and less than or equal to 16 The diffusion particles 12 can effectively improve the uniformity of the light emitted by the light emitters 3.

Third Embodiment

Figure 3A:
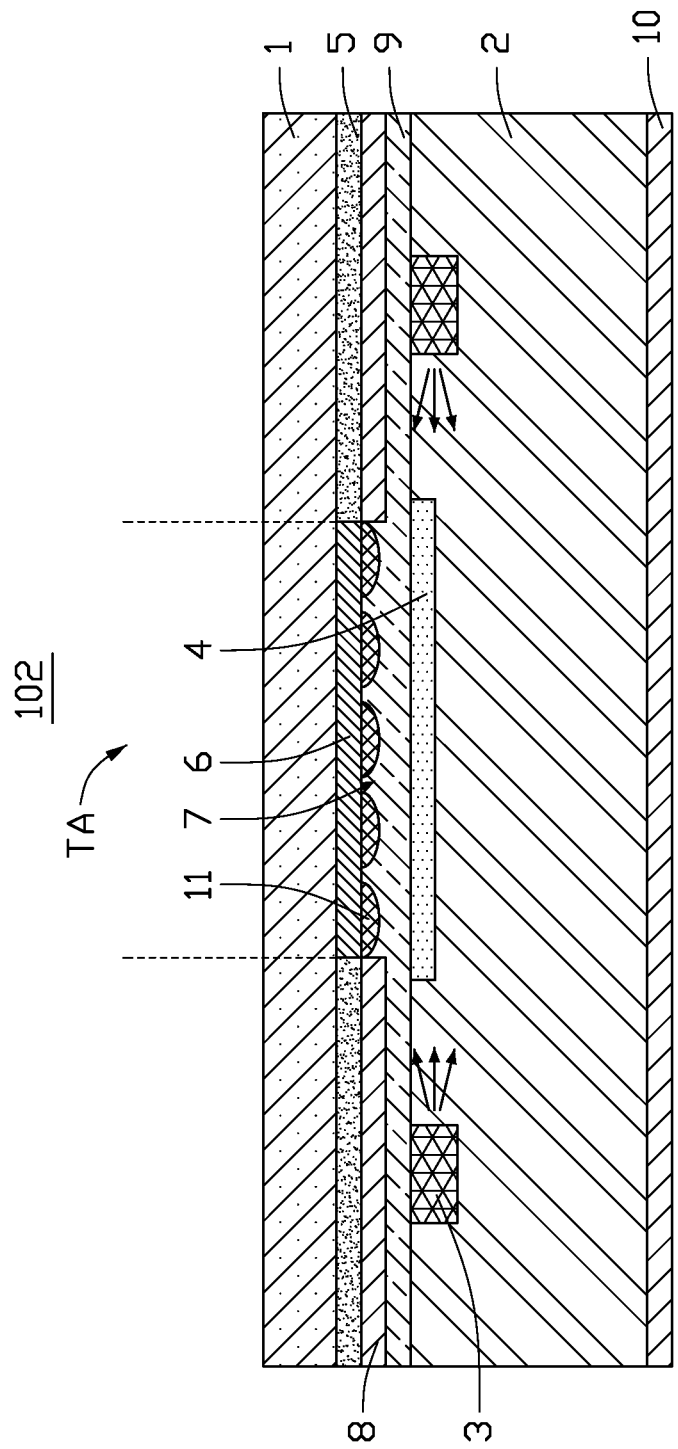
FIG. 3A is a cross-sectional view of a light-emitting assembly according to a third embodiment of the present disclosure.

FIG. 3A shows a light-emitting assembly 102 according to a third embodiment. The difference between the light-emitting assembly 102 and the light-emitting assembly 100 is that the light-emitting assembly 102 further includes an array of light guide dots 11 opposite to the light-transmitting area TA. The array of light guide dots 11 changes a transmission direction of the light emitted by the light emitters 3 in the light guide layer 2. In the light-emitting assembly 102, the array of light guide dots 11 is between the first substrate 1 and the light guide layer 2 and in the opening 7. The transparent insulating layer 9 covers the array of light guide dots 11 and the first reflective layer 8.

The array of light guide dots 11 of the light-emitting assembly 102 can further improve the light utilization rate of the light emitters 3, so that more light emitted by the light emitters 3 can pass through the hole 6 (i.e., the light-transmitting area TA). If the light emitted by the light emitters 3 is totally reflected in the light guide layer 2, the light cannot be transmitted to the hole 6 (i.e., the light-transmitting area TA). In the light-emitting assembly 102, the array of light guide dots 11 can change the propagation direction of the emitted light of the light emitters 3 for total reflection, so that more of the emitted light of the light emitters 3 can pass through the hole 6. Therefore, the utilization rate of the light-emitting assembly 102 is further increased and the light-emitting range of the light-emitting assembly 102 is enlarged.

Fourth Embodiment

Figure 4A:
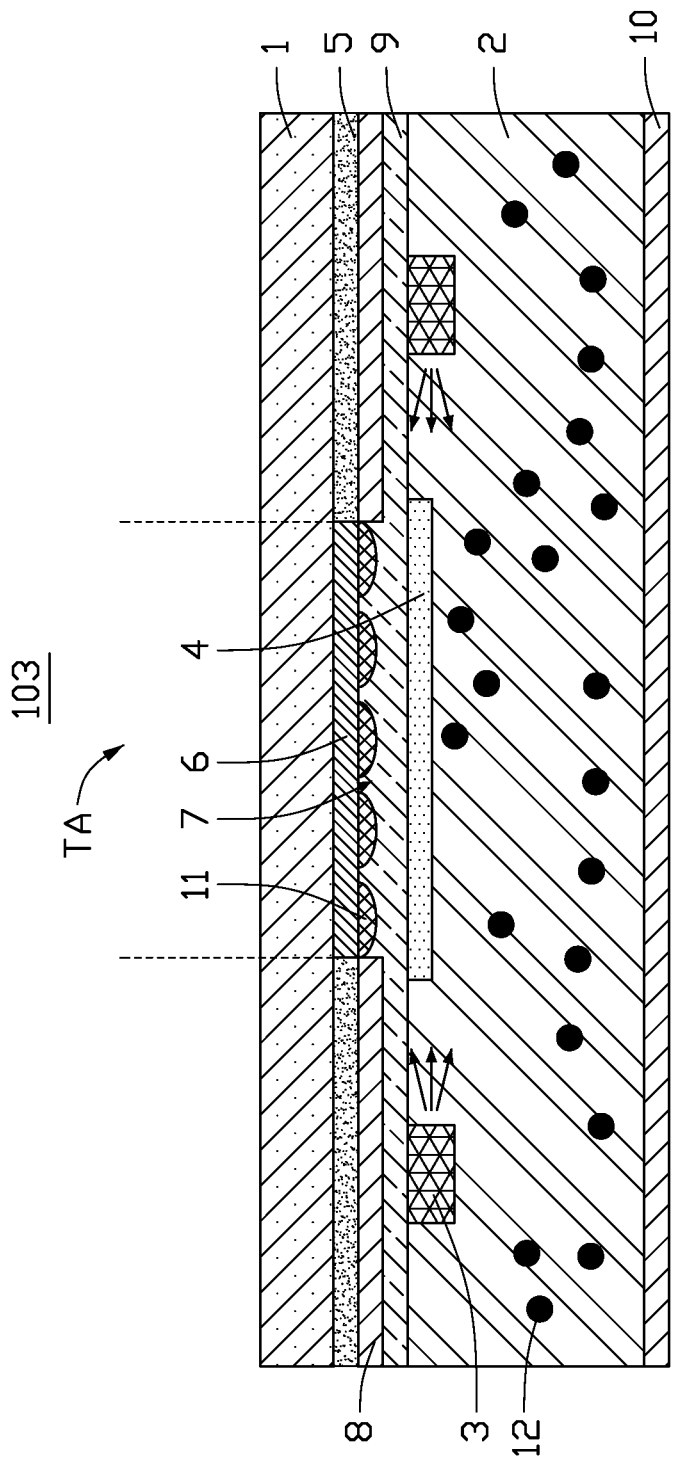
FIG. 4A is a cross-sectional view of a light-emitting assembly according to a fourth embodiment of the present disclosure.
Figure 4B:
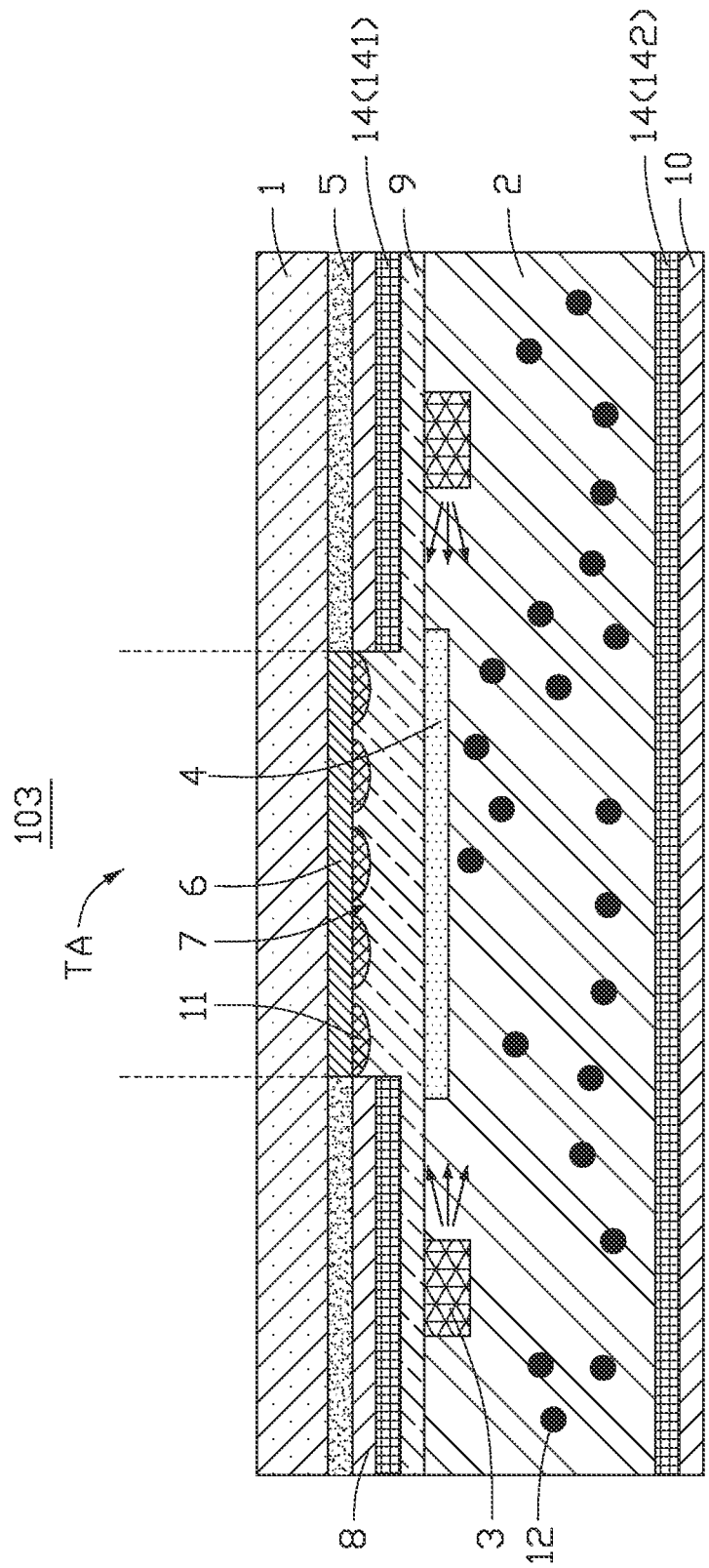
FIG. 4B is a cross-sectional view of a modified embodiment of the light-emitting assembly in FIG. 4A.

FIG. 4A shows a light emitting component 103 according to a fourth embodiment. The difference between the light-emitting assembly 103 and the light-emitting assembly 102 is that the light-emitting assembly 103 further includes diffusion particles 12 distributed in the light guide layer 2. The diffusion particles 12 can effectively improve the uniformity of the light emitted by the light emitters 3.

Modified Embodiments According to the First to Fourth Embodiments

Figure 1B:
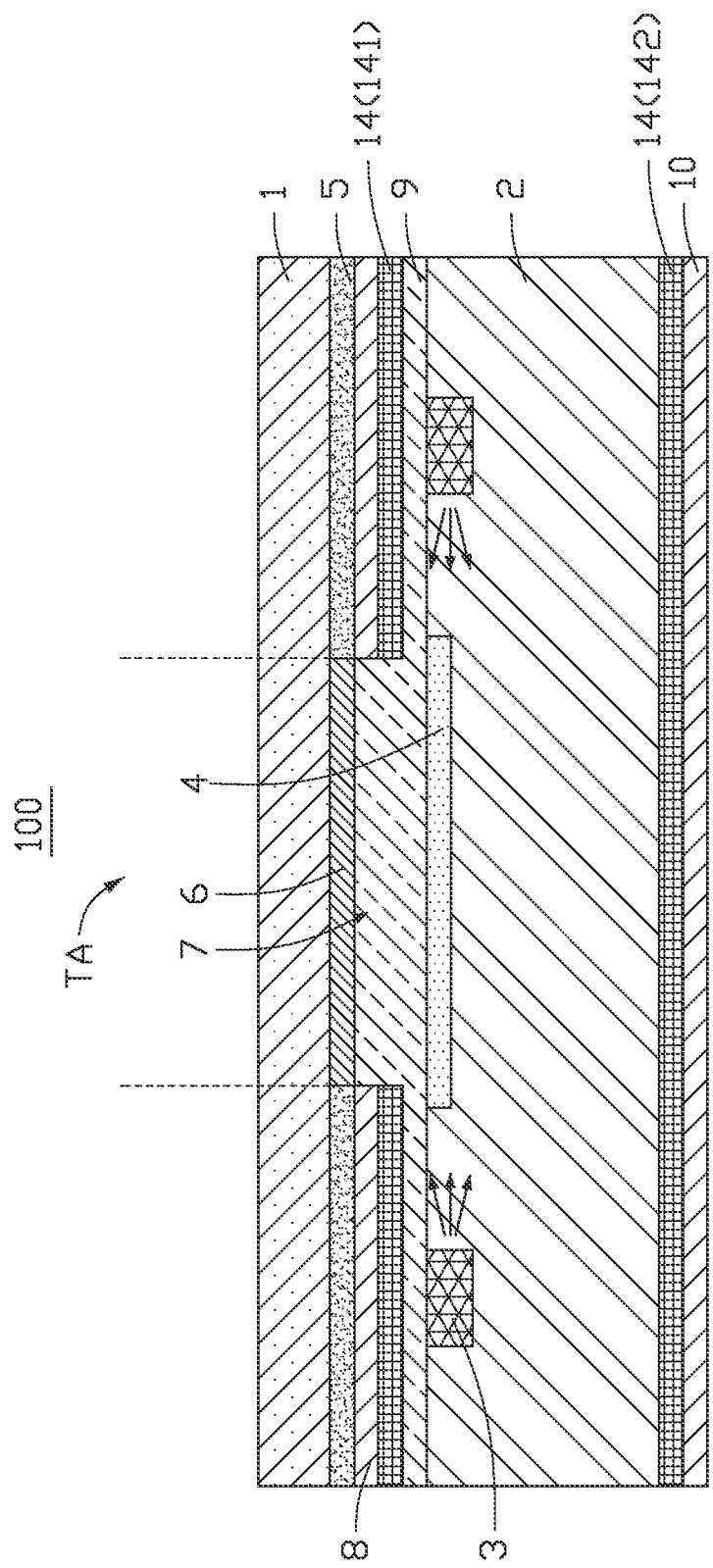
FIG. 1B is a cross-sectional view of a modified embodiment of the light-emitting assembly in FIG. 1A.
Figure 2B:
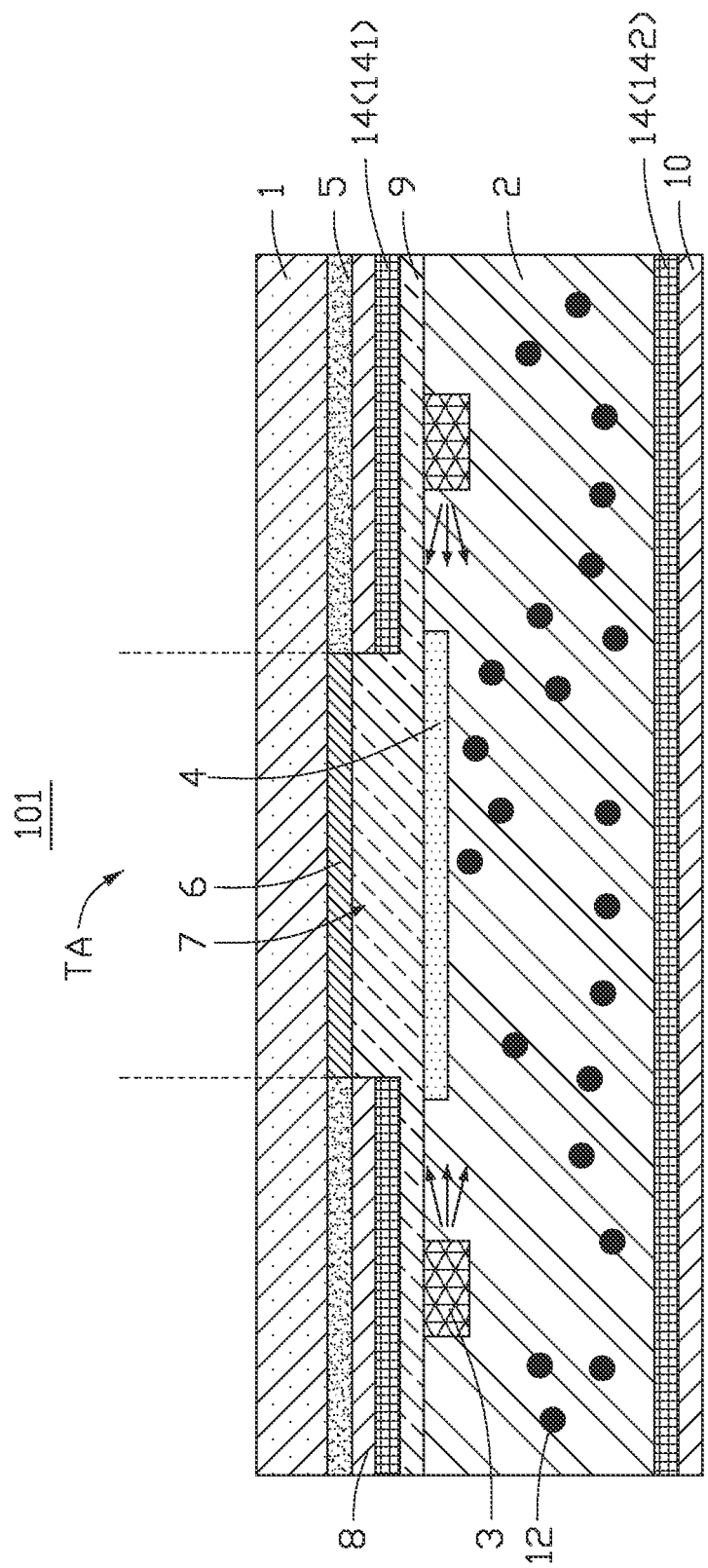
FIG. 2B is a cross-sectional view of a modified embodiment of the light-emitting assembly in FIG. 2A.
Figure 3B:
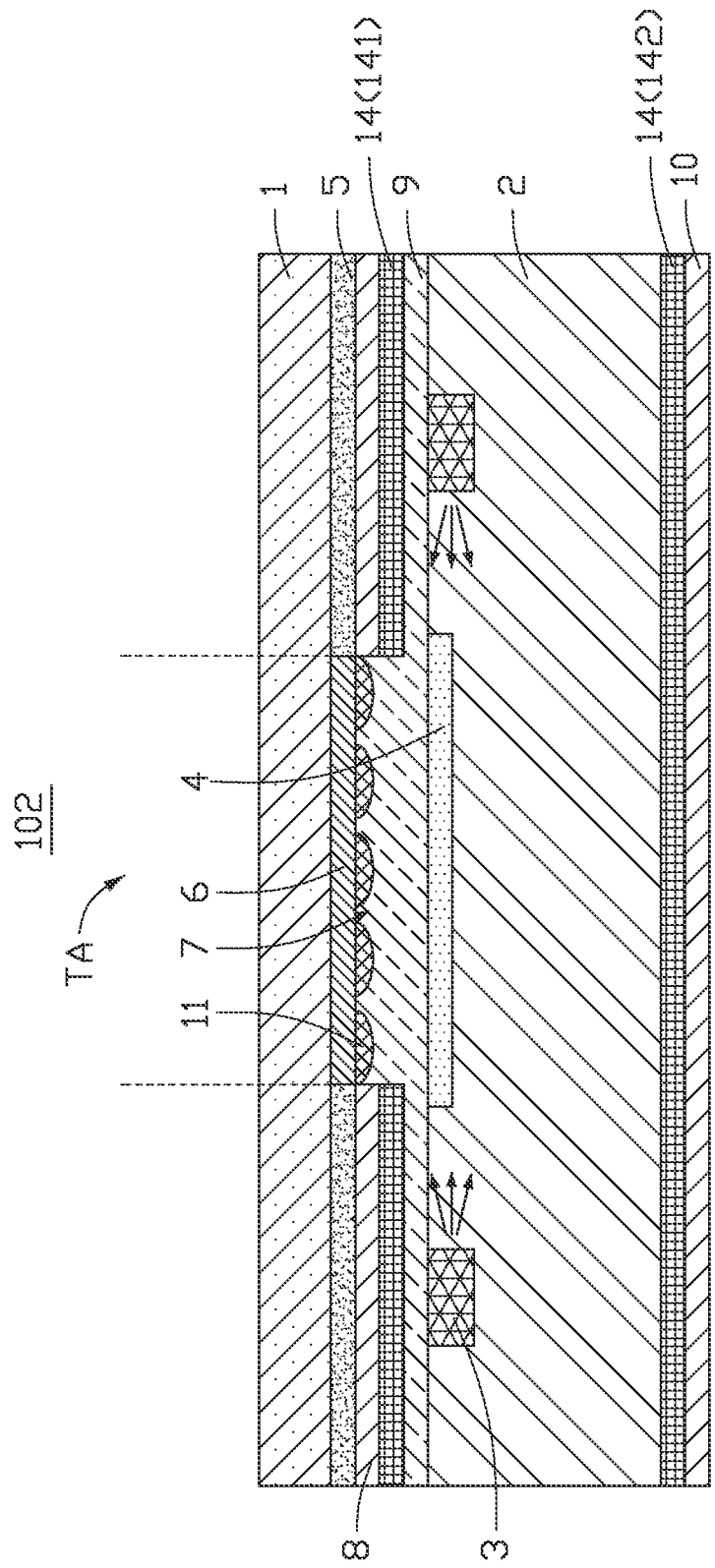
FIG. 3B is a cross-sectional view of a modified embodiment of the light-emitting assembly in FIG. 3A.

As shown in FIGS. 1B, 2B, 3B, in modified embodiments according to the first to fourth embodiments, each of the light-emitting assemblies 100, 101, 102, and 103 can further include two diffusion layers 14. One of the diffusion layers 14 (i.e., an upper diffusion layer 141) is on a side of the first reflective layer 8 away from the first substrate 1 and the other of the diffusion layers 14 (i.e., a lower diffusion layer 142) is on a side of the second reflective layer 10 adjacent to the light guide layer 2. Alternatively, in other modified embodiments according to the first to fourth embodiments, each of the light-emitting assemblies 100, 101, 102, and 103 may include only one diffusion layer 14. The only one diffusion layer 14 is on a side of the first reflective layer 8 away from the first substrate 1 or is on a side of the second reflective layer 10 adjacent to the light guide layer 2. The diffusion layer 14 is beneficial to diffuse and homogenize light emitted by the light emitters 3.

Figure 5:
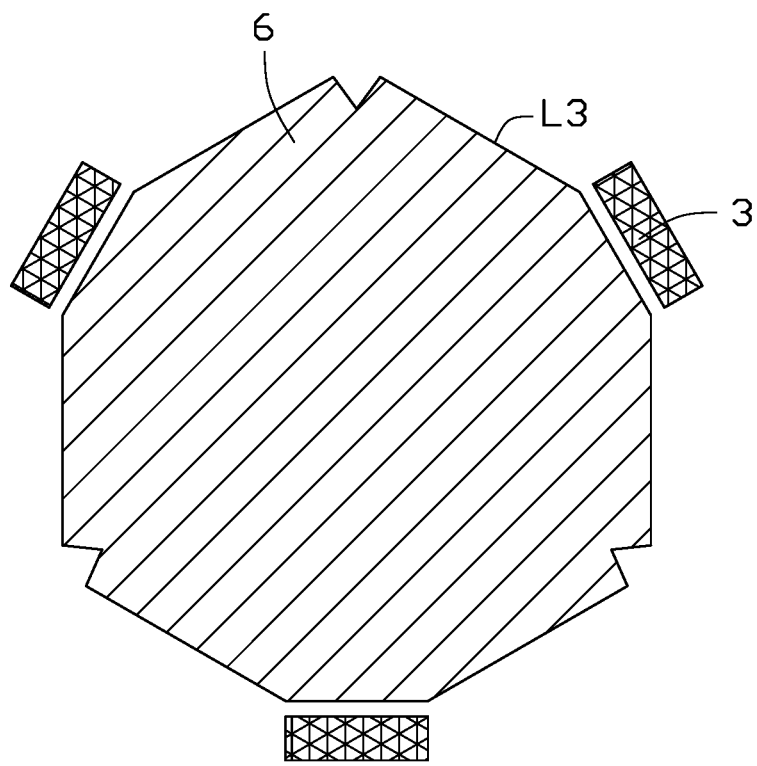
FIG. 5 is a schematic diagram showing a light-emitting range of light emitted by the light emitters after passing through the hole according to an embodiment of the present disclosure.

The light-emitting assembly including the light guide layer 2, the first reflective layer 8, the second reflective layer 10, the array of light guide dots 11, and the diffusion layer 14 can effectively improve the uniformity and utilization of the light emitted by light emitters 3, thereby increasing the range of the light emitted by the light emitters 3 to the hole 6. The light emitted by the light emitters 3 completely covers and illuminates the function icon, as shown in FIG. 5. In FIG. 5, a shaded area with diagonal lines represents the light-emitting range of the light-emitting element 3 at the hole 6. Bold line L3 in FIG. 5 shows the entire boundary of the hole 6. Since the hole 6, the opening 7 and the light-transmitting area TA are aligned with each other, the hole 6 and/or the opening 7 defines a boundary of the light-transmitting area of the first substrate 1 where light can be transmitted through the hole 6 and the opening 7. The bold line L3 further indicates an entire boundary of the opening 7, as well as an entire boundary of the light-transmitting area. That is, the boundary of the hole 6 and the boundary of the opening 7 are both aligned with the boundary of the light-transmitting area of the first substrate 1, the boundary of a projection of the hole 6 on the first substrate 1 coincides with the boundary of the light-transmitting area, and the boundary of a projection of the opening 7 on the first substrate 1 coincides with the boundary of the light-transmitting area. A shape of the light-emitting range of the light emitters 3 is not limited to that shown in FIG. 5, and it changes with the shape of the function icon defined by the hole 6.

In other embodiments, the first reflective layer 8 is made of a non-metallic material, and the transparent insulating layer 9 in the light-emitting assemblies 100, 101, 102, and 103 can be omitted. For example, the first reflective layer 8 may be ink, which can be printed on the light-shielding layer 5.

Fifth Embodiment

Figure 6A:
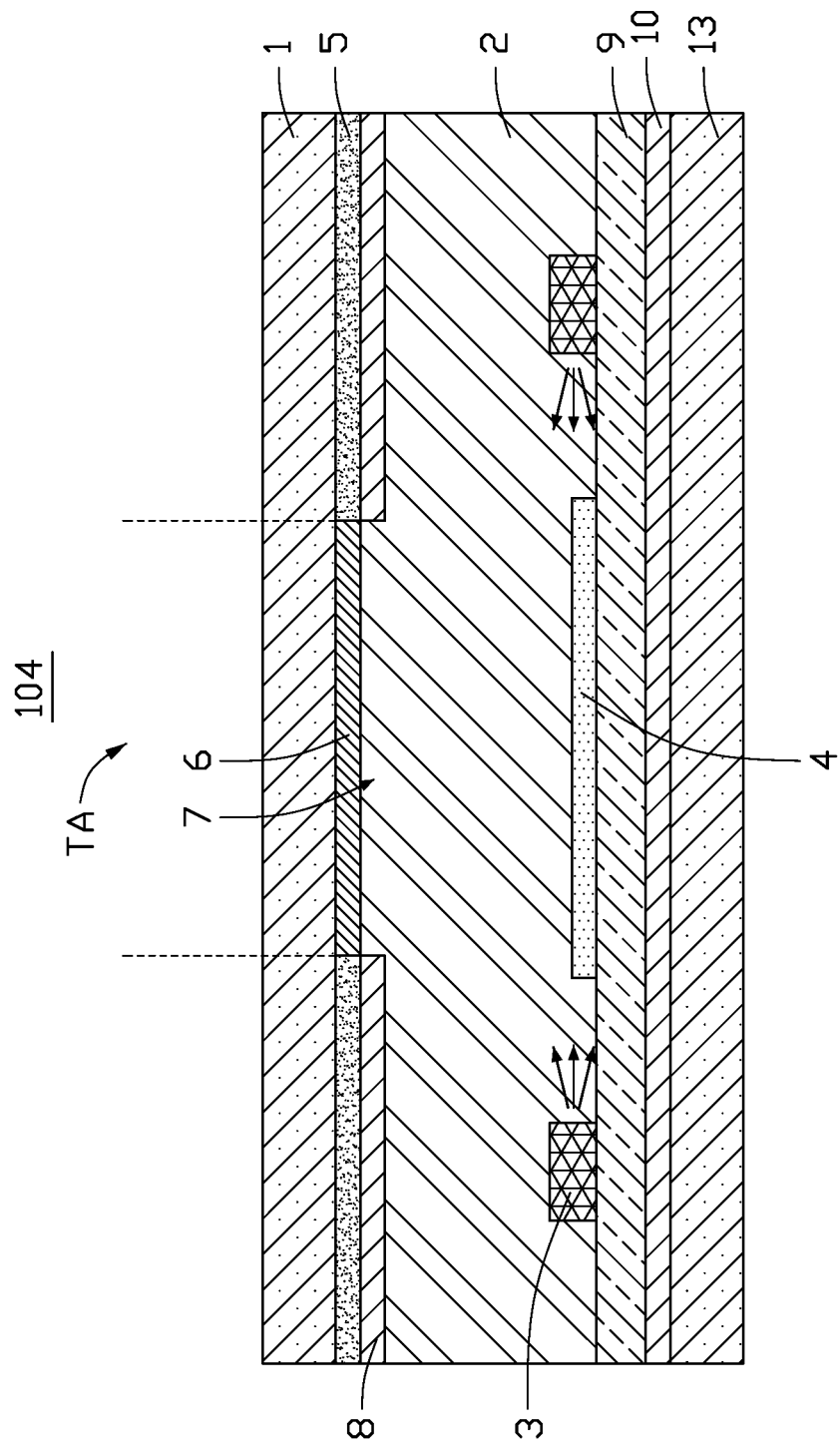
FIG. 6A is a cross-sectional view of a light-emitting assembly according to a fifth embodiment of the present disclosure.

FIG. 6A shows a light-emitting assembly 104 according to a fifth embodiment. The difference between the light-emitting assembly 104 and the light-emitting assembly 100 is that the light-emitting assembly 104 further includes a second substrate 13 opposite to the first substrate 1. The second substrate 13 is on a side of the light guide layer 2 away from the first substrate 1, and the second reflective layer 10 is on a side of the second substrate 13 adjacent to the first substrate 1. In the light-emitting assembly 100, the transparent insulating layer 9 is between the first reflective layer 8 and the light guide layer 2. While in the light-emitting assembly 104, the transparent insulating layer 9 is between the second reflective layer 10 and the light guide layer 2.

In the light-emitting assembly 104, the light emitters 3 and the touch sensor 4 are on the transparent insulating layer 9, and the light guide layer 2 covers the light emitters 3, the touch sensor 4, the first reflective layer 8, the transparent insulating layer 9, and fills into the opening 7.

The light emitted by the light emitters 3 passes through the light guide layer 2, reaches the first reflective layer 8 or the second reflective layer 10, and is reflected by the first reflective layer 8 or the second reflective layer 10. Thereby, the propagation direction of the light emitted by the light emitters 3 is changed, so that more of the light emitted by the light emitters 3 can pass through the light-transmitting area TA defined by the hole 6, and a light emitting range of the light-emitting assembly 100 is expanded.

Sixth Embodiment

Figure 7A:
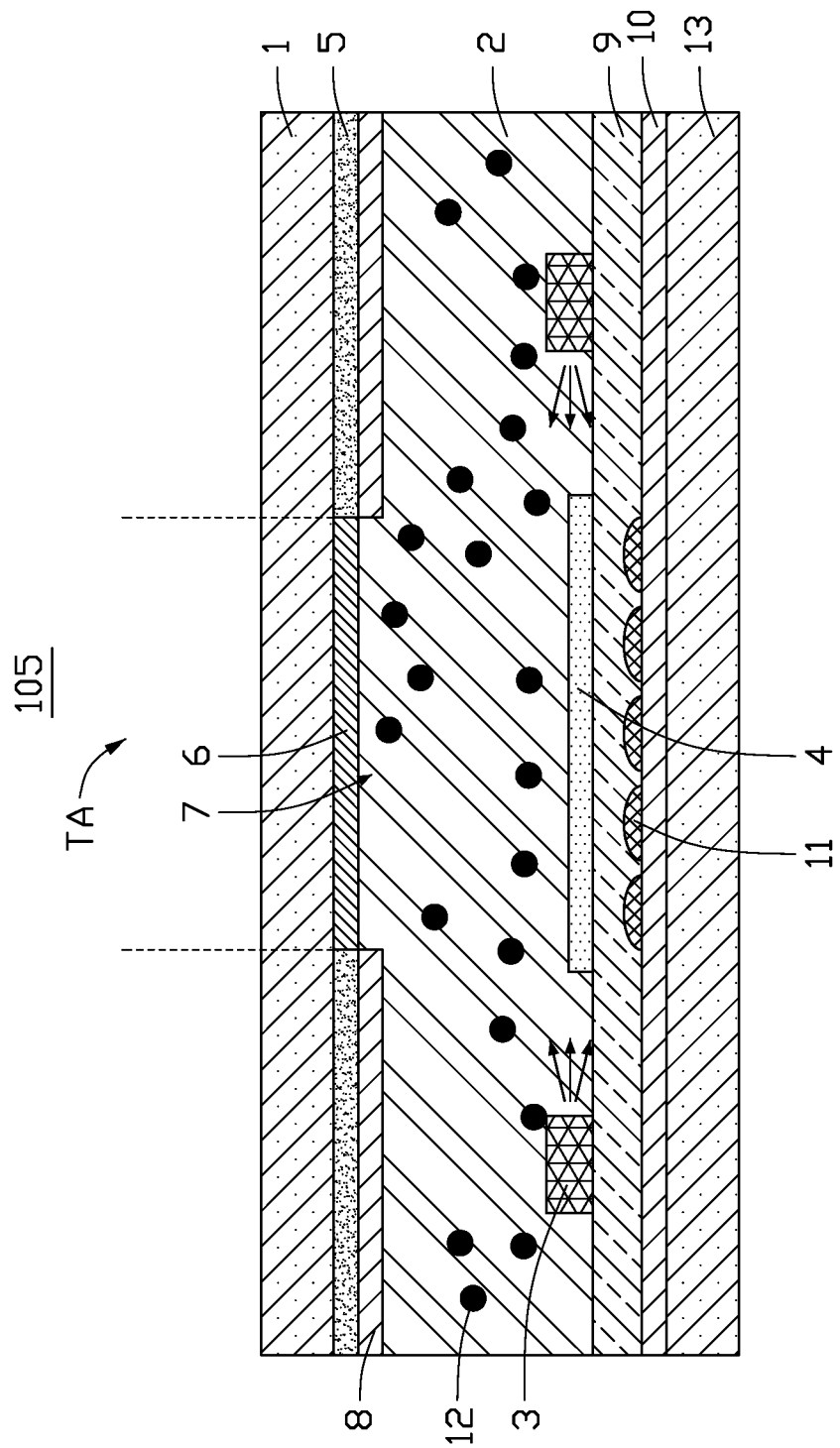
FIG. 7A is a cross-sectional view of a light-emitting assembly according to a sixth embodiment of the present disclosure.

FIG. 7A shows a light-emitting assembly 105 according to a sixth embodiment. the light-emitting assembly 104 according to the fifth embodiment of the present disclosure. The difference between the light-emitting assembly 105 and the light-emitting assembly 104 is that the light-emitting assembly 105 further includes an array of light guide dots 11 opposite to the light-transmitting area TA. The array of light guide dots 11 changes a transmission direction of the light emitted by the light emitters 3 in the light guide layer 2. In the light-emitting assembly 105, the array of light guide dots 11 is on a side of the second reflective layer 10 adjacent to the light guide layer 2, and the transparent insulating layer 9 covers the array of light guide dots 11. The light-emitting assembly 105 further includes diffusion particles 12 distributed in the light guide layer 2. The diffusion particles 12 can effectively improve the uniformity of the light emitted by the light emitters 3.

Seventh Embodiment

Figure 8A:
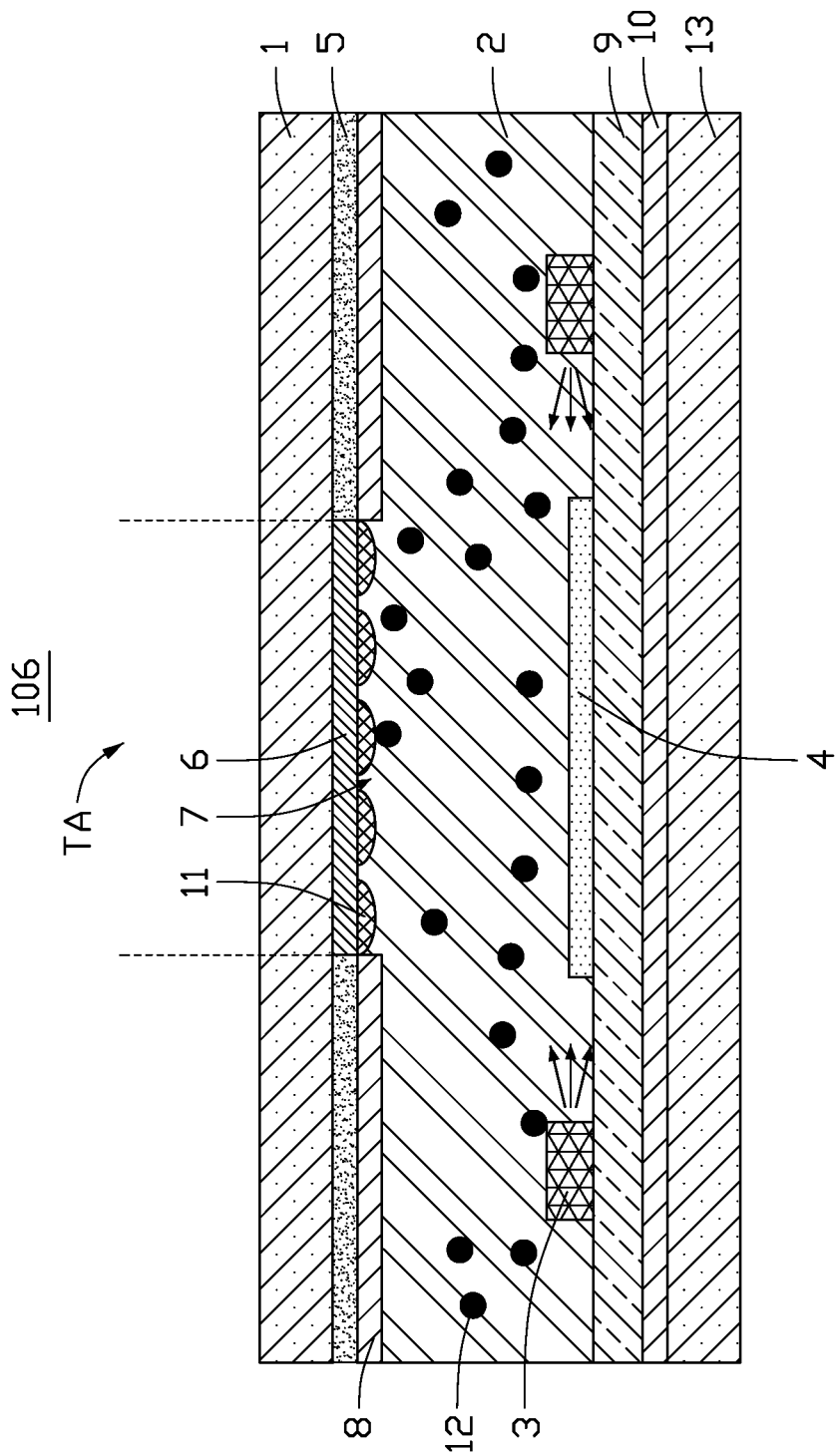
FIG. 8A is a cross-sectional view of a light-emitting assembly according to a seventh embodiment of the present disclosure.

FIG. 8A shows a light-emitting assembly 106 according to a seventh embodiment. The difference between the light-emitting assembly 106 and the light-emitting assembly 104 is that the light-emitting assembly 106 further includes an array of light guide dots 11 opposite to the light-transmitting area TA. The array of light guide dots 11 changes a transmission direction of the light emitted by the light emitters 3 in the light guide layer 2. The array of light guide dots 11 is between the first substrate 1 and the light guide layer 2 and in the opening 7. The light guide layer 2 covers the first reflective layer 8 and the array of light guide dots 11.

the light-emitting assembly 106 further includes diffusion particles 12 distributed in the light guide layer 2.

The diffusion particles 12 can effectively improve the uniformity of the light emitted by the light emitters 3.

The array of light guide dots 11 of the light-emitting assemblies 105 and 106 can further improve the utilization rate of the emitted light of the light emitters 3, so that more the light emitted by the light emitters 3 can pass through the hole 6. If the light emitted by the light emitters 3 is totally reflected in the light guide layer 2, the light cannot be transmitted to the hole 6 (i.e., the light-transmitting area TA). In the light-emitting assembly 102, the array of light guide dots 11 can change the propagation direction of the emitted light of the light emitters 3 for total reflection, so that more of the emitted light of the light emitters 3 can pass through the hole 6. Therefore, the utilization rate of the light-emitting assemblies 105 and 106 is further increased and the light-emitting range of the light-emitting assembly 102 is enlarged.

Modified Embodiments According to the Fifth to Seventh Embodiments

Figure 6B:
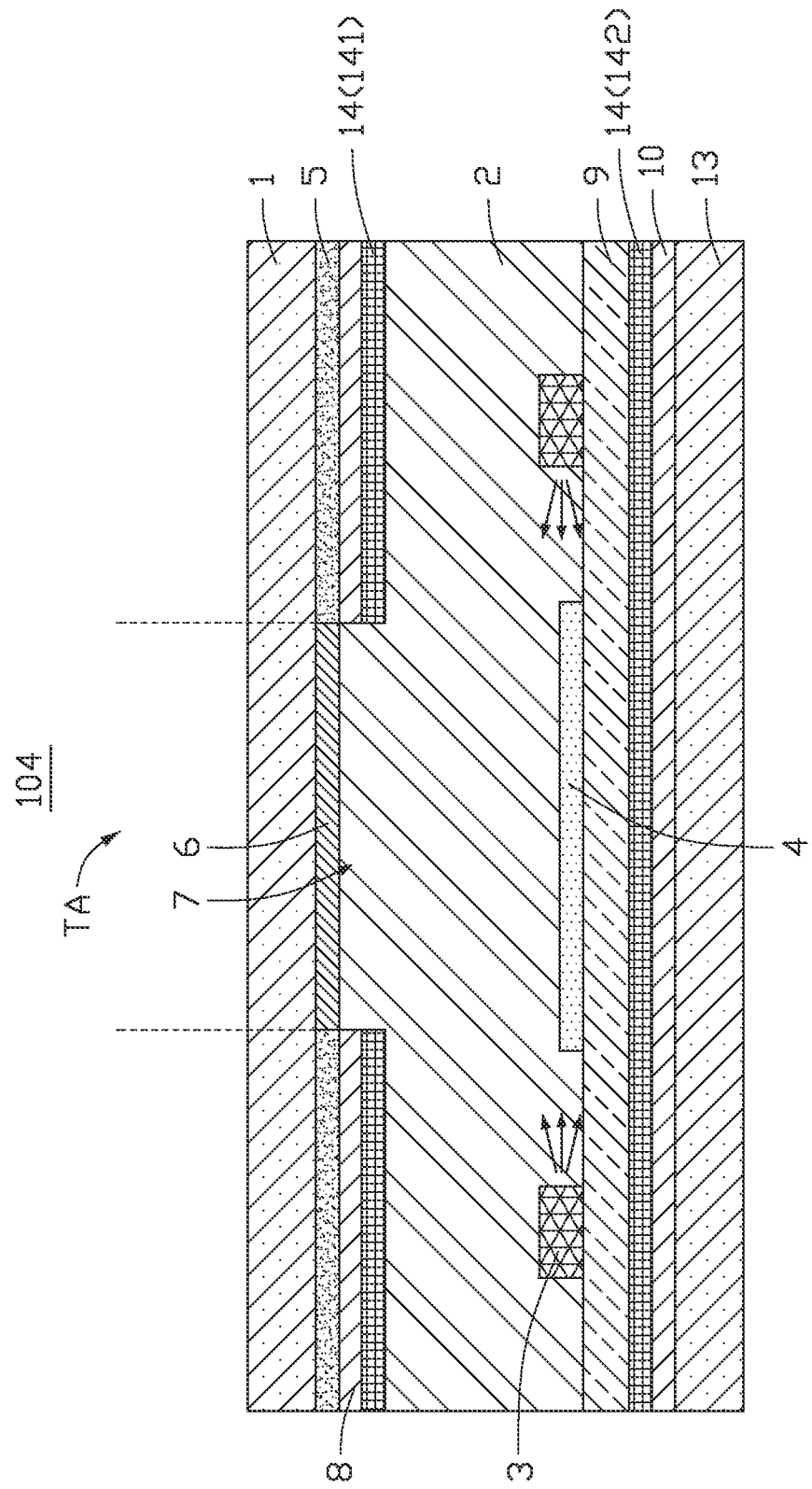
FIG. 6B is a cross-sectional view of a modified embodiment of the light-emitting assembly in FIG. 6A.
Figure 7B:
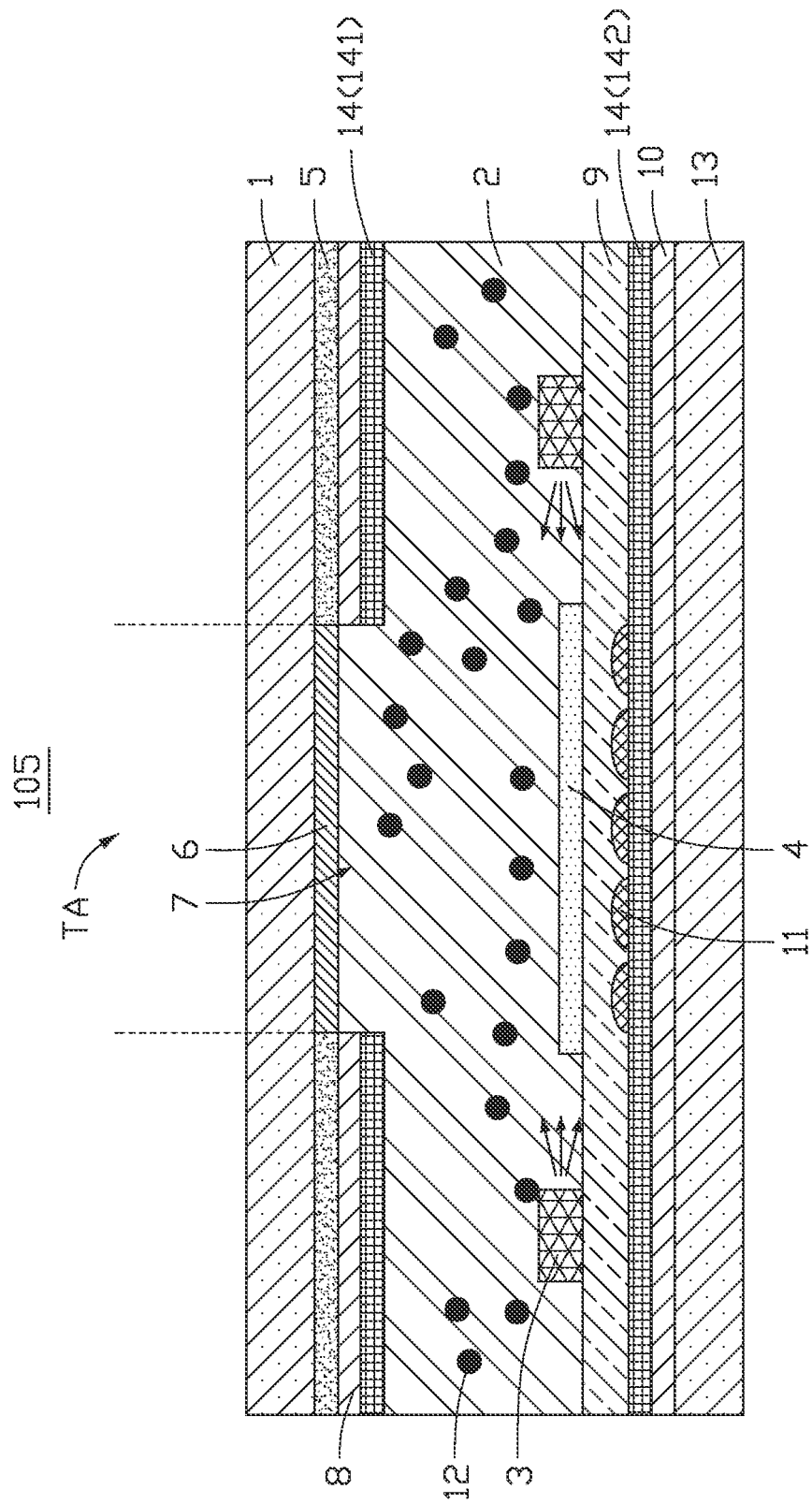
FIG. 7B is a cross-sectional view of a modified embodiment of the light-emitting assembly in FIG. 7A.
Figure 8B:
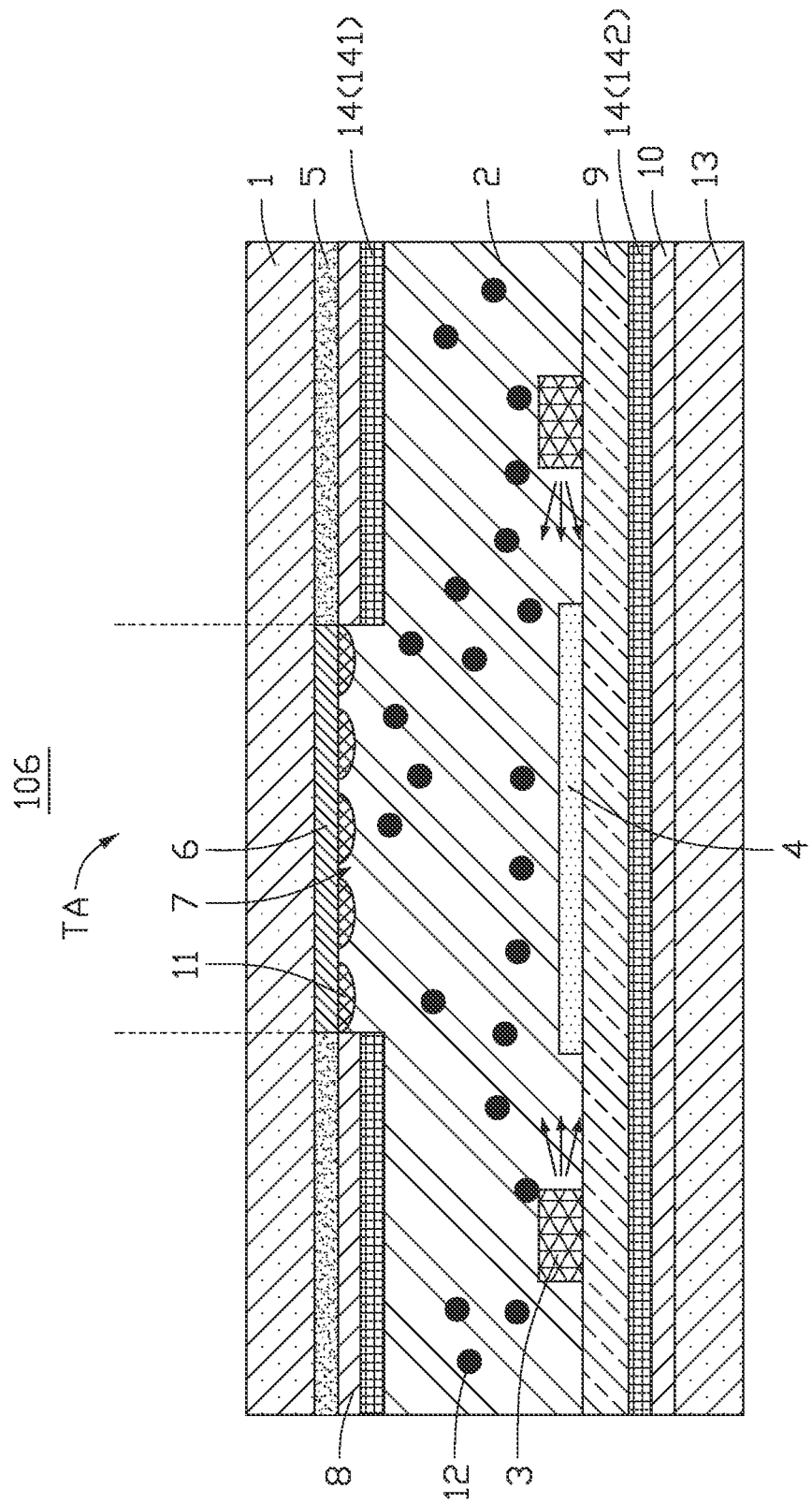
FIG. 8B is a cross-sectional view of a modified embodiment of the light-emitting assembly in FIG. 8A.

As shown in FIGS. 6B, 7B, 8B, in modified embodiments according to the fifth to seventh embodiments, each of the light-emitting assemblies 104, 105, and 106 can further include two diffusion layers 14. One of the diffusion layers 14 (i.e., the upper diffusion layer 141) is on a side of the first reflective layer 8 away from the first substrate 1 and the other of the diffusion layers 14 (i.e., the lower diffusion layer 142) is on a side of the second reflective layer 10 adjacent to the light guide layer 2. Alternatively, in other modified embodiments according to the fifth to seventh embodiments, each of the light-emitting assemblies 104, 105, and 106 may include only one diffusion layer 14. The only one diffusion layer 14 is on a side of the first reflective layer 8 away from the first substrate 1 or is on a side of the second reflective layer 10 adjacent to the light guide layer 2. The diffusion layer 14 is beneficial to diffuse and homogenize light emitted by the light emitters 3.

The light-emitting assembly including the light guide layer 2, the first reflective layer 8, the second reflective layer 10, the array of light guide dots 11, and the diffusion layer 14 can effectively improve the uniformity and utilization of the light emitted by light emitters 3, thereby increasing the range of the light emitted by the light emitters 3 to the hole 6. The light emitted by the light emitters 3 completely covers and illuminates the function icon, as shown in FIG. 5.

In other embodiments, the second reflective layer 10 is made of a non-metallic material, and the transparent insulating layer 9 in the light-emitting assemblies 104, 105, and 106 can be omitted. For example, the second reflective layer 10 may be ink, which can be printed on the second substrate 13.

Eighth Embodiment

Figure 9A:
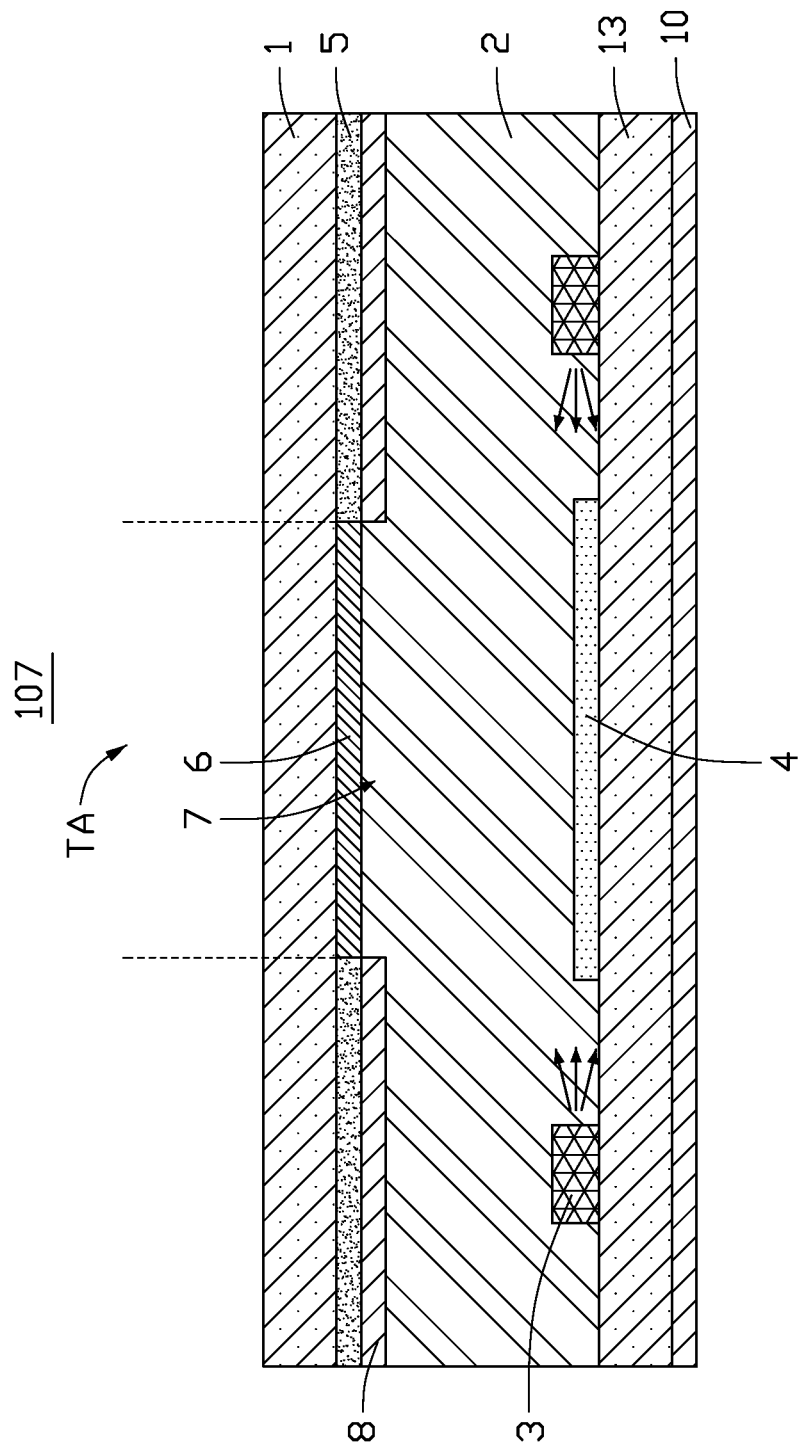
FIG. 9A is a cross-sectional view of a light-emitting assembly according to an eighth embodiment of the present disclosure.

FIG. 9A shows a light-emitting assembly 107 according to an eighth embodiment. The difference between the light-emitting assembly 107 and the light-emitting assembly 100 is that the light-emitting assembly 107 further includes a second substrate 13 opposite to the first substrate 1. The second substrate 13 is on a side of the light guide layer 2 away from the first substrate 1, and the second reflective layer 10 is on a side of the second substrate 13 away from the first substrate 1. The light-emitting assembly 100 includes a transparent insulating layer 9, while the light-emitting assembly 106 has no transparent insulating layer. In the light-emitting assembly 100, the light emitters 3 and the touch sensor 4 are on the transparent insulating layer 9, while in the light-emitting assembly 107, the light emitters 3 and the touch sensor 4 are on the second substrate 13, the light guide layer 2 covers the first reflective layer 8, the light emitters 3, the touch sensor 4 and the second substrate 13, and fills into the opening 7.

In the light-emitting assembly 107, the second substrate 13 is transparent.

The light emitted by the light emitters 3 passes through the light guide layer 2, reaches the first reflective layer 8 or the second reflective layer 10, and is reflected by the first reflective layer 8 or the second reflective layer 10. Thereby, the propagation direction of the light emitted by the light emitters 3 is changed, so that more of the light emitted by the light emitters 3 can pass through the light-transmitting area TA defined by the hole 6, and a light emitting range of the light-emitting assembly 107 is expanded.

Ninth Embodiment

Figure 10A:
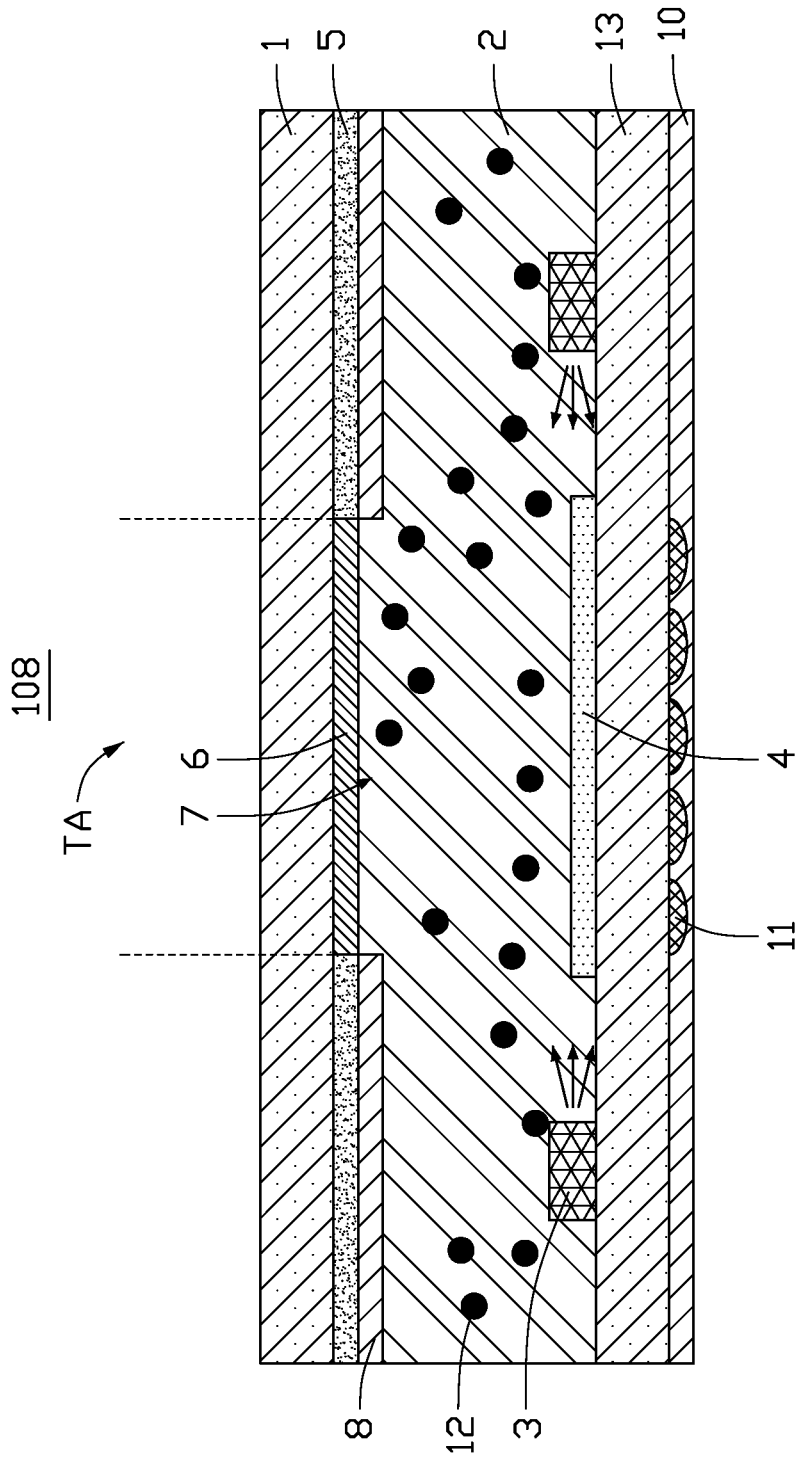
FIG. 10A is a cross-sectional view of a light-emitting assembly according to a ninth embodiment of the present disclosure.

FIG. 10A shows a light-emitting assembly 108 according to a ninth embodiment. The difference between the light-emitting assembly 108 and the light-emitting assembly 107 is that the light-emitting assembly 108 further includes an array of light guide dots 11 opposite to the light-transmitting area TA. The array of light guide dots 11 changes a transmission direction of the light emitted by the light emitters 3 in the light guide layer 2. The array of light guide dots 11 is on a side of the second reflective layer 10 adjacent to the light guide layer 2. The array of light guide dots 11 is on a side of the second substrate 13 away from the first substrate 1, and the second reflective layer 10 covers the array of light guide dots 11. The light-emitting assembly 108 further includes diffusion particles 12 distributed in the light guide layer 2. The diffusion particles 12 can effectively improve the uniformity of the light emitted by the light emitters 3.

Tenth Embodiment

Figure 11A:
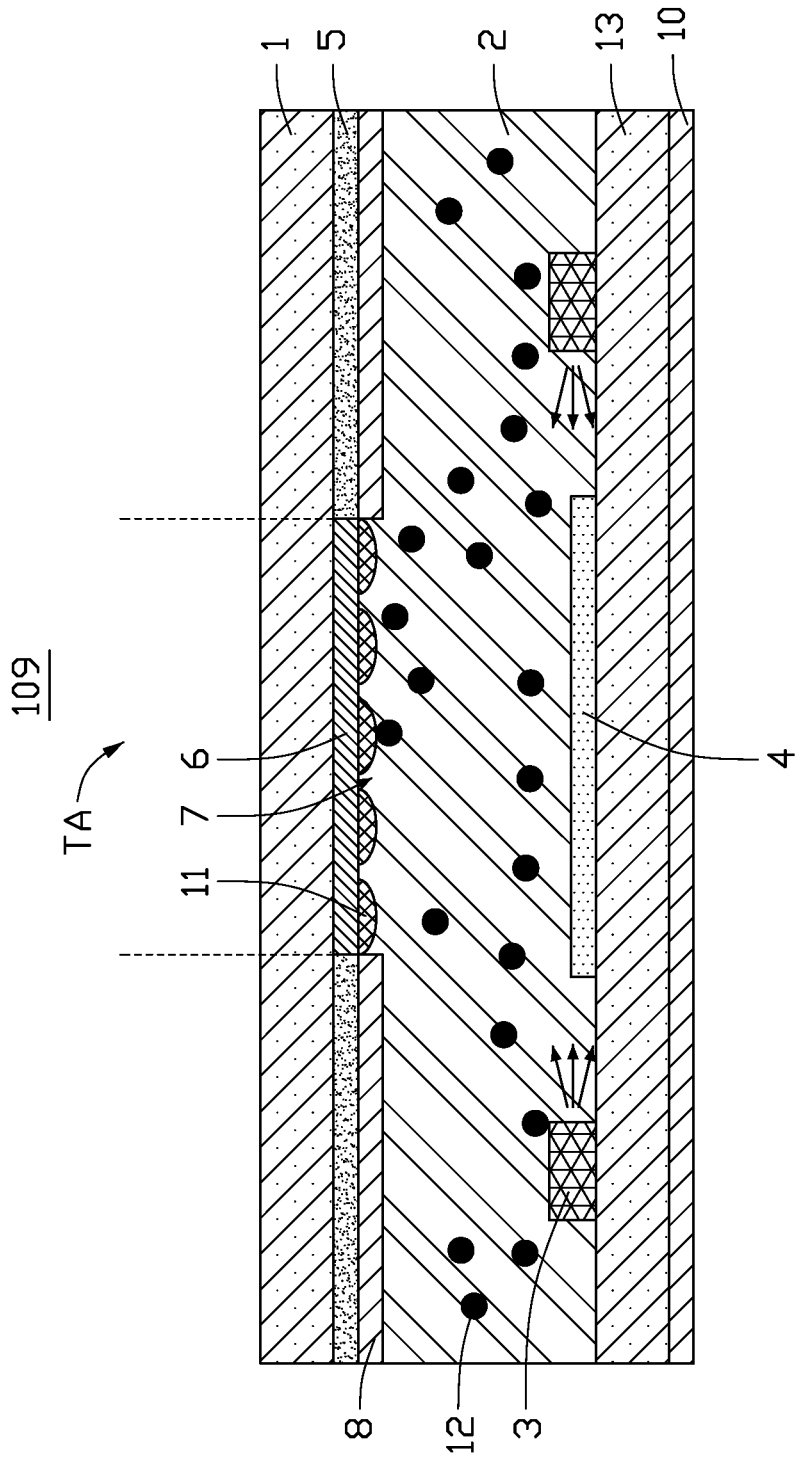
FIG. 11A is a cross-sectional view of a light-emitting assembly according to a tenth embodiment of the present disclosure.

FIG. 11A shows a light-emitting assembly 109 according to a tenth embodiment. The difference between the light-emitting assembly 109 and the light-emitting assembly 107 is that the light-emitting assembly 109 further includes an array of light guide dots 11 opposite to the light-transmitting area TA (i.e., the hole 6). The array of light guide dots 11 changes a transmission direction of the light emitted by the light emitters 3 in the light guide layer 2. In the light-emitting assembly 109, the array of light guide dots 11 is between the first substrate 1 and the light guide layer 2 and in the opening 7. The light guide layer 2 covers the first reflective layer 8 and the array of light guide dots 11 and fills into the opening 7.

The light-emitting assembly 109 further includes diffusion particles 12 distributed in the light guide layer 2. The diffusion particles 12 can effectively improve the uniformity of the light emitted by the light emitters 3.

The array of light guide dots 11 of the light-emitting assemblies 108 and 109 can further increase the utilization rate of the light emitted by the light emitters 3, so that more light emitted by the light emitters 3 can pass through the hole 6. If the light emitted by the light emitters 3 is totally reflected in the light guide layer 2, the light cannot be transmitted to the hole 6 (i.e., the light-transmitting area TA). In the light-emitting assemblies 108 and 109, the array of light guide dots 11 can change the propagation direction of the emitted light of the light emitters 3 for total reflection, so that more of the emitted light of the light emitters 3 can pass through the hole 6. Therefore, the utilization rate of the light-emitting assemblies 105 and 106 is further increased and the light-emitting range of the light-emitting assembly 102 is enlarged.

Modified Embodiments According to the Eighth to Tenth Embodiments

Figure 9B:
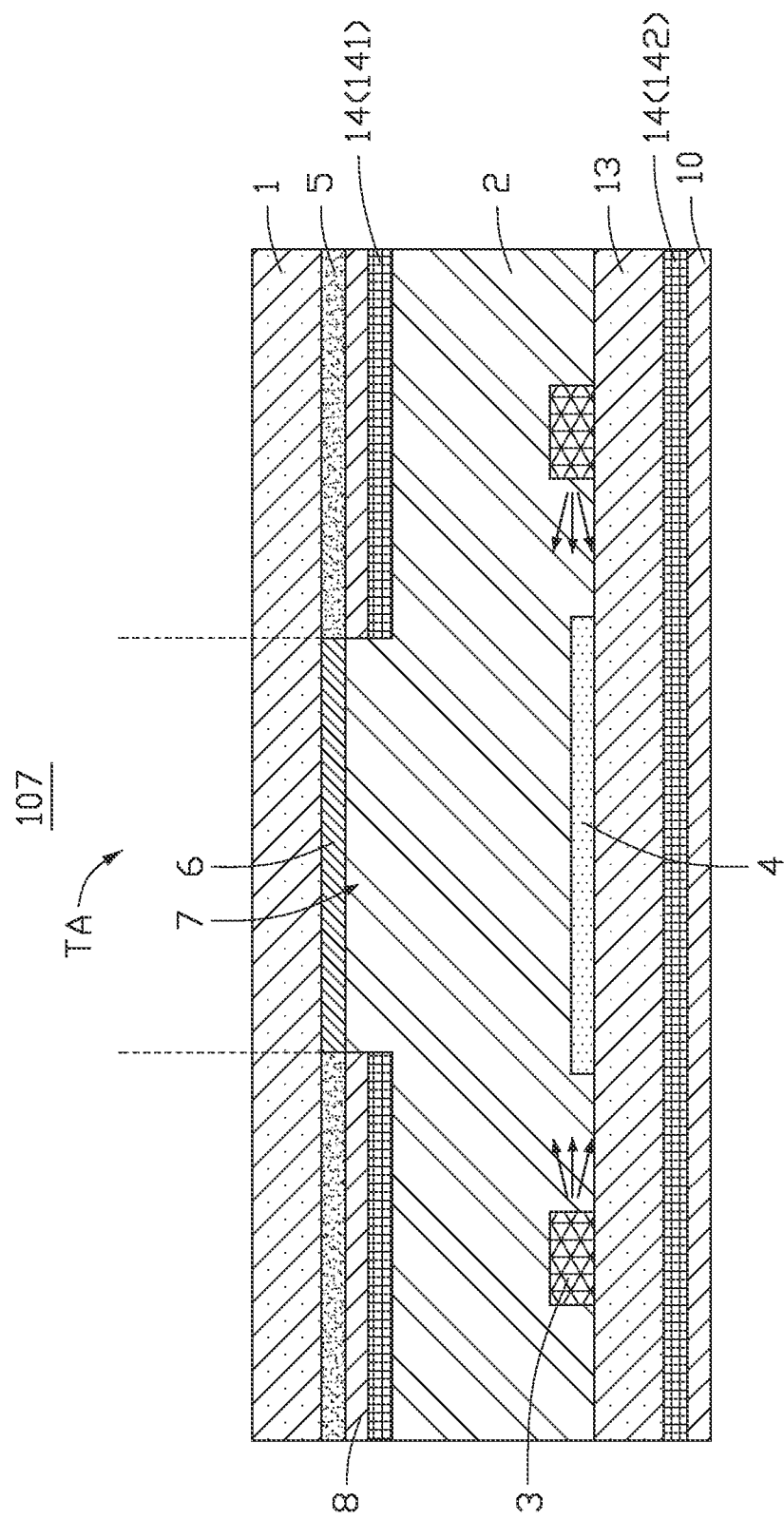
FIG. 9B is a cross-sectional view of a modified embodiment of the light-emitting assembly in FIG. 9A.
Figure 10B:
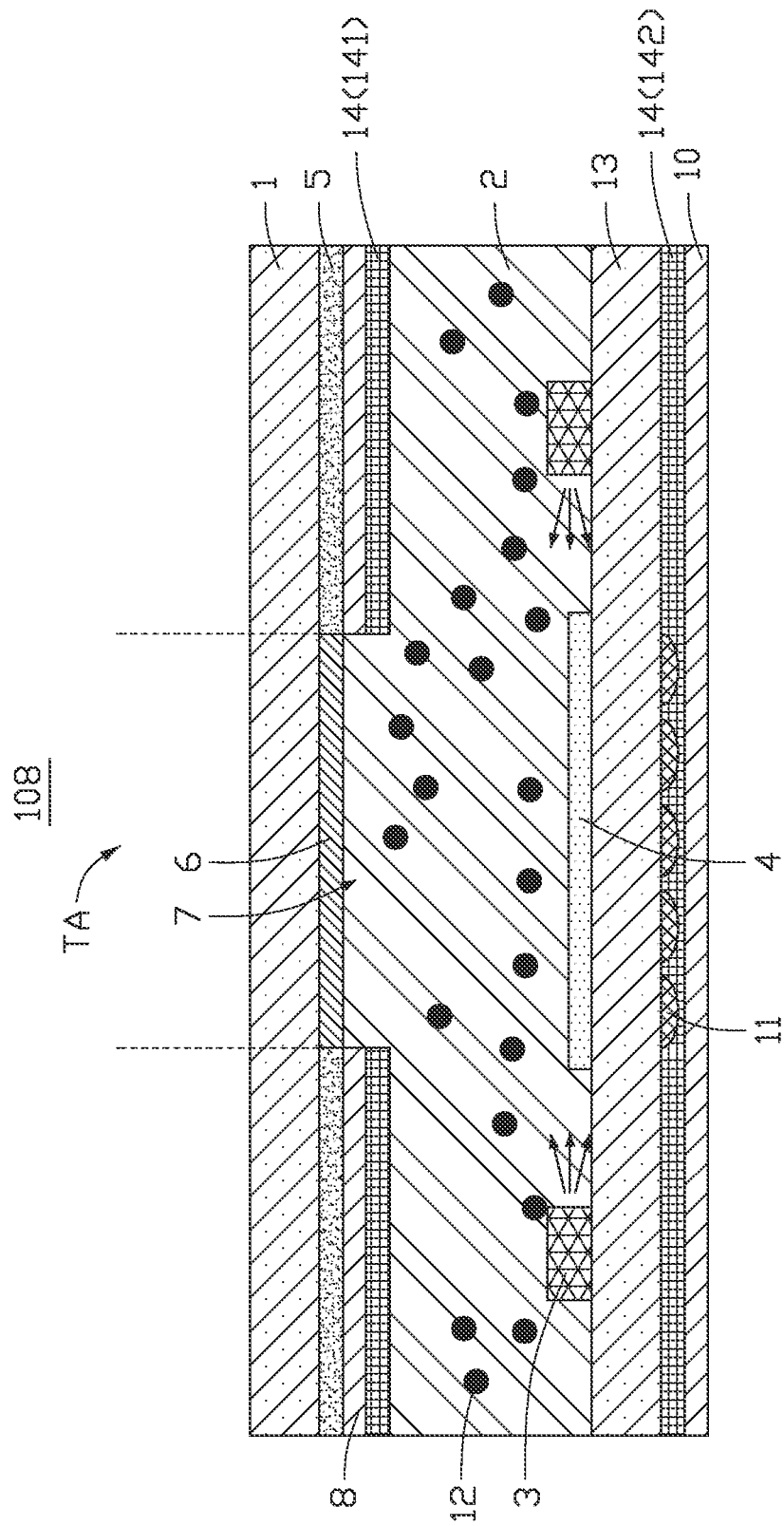
FIG. 10B is a cross-sectional view of a light-emitting assembly in FIG. 10A.
Figure 11B:
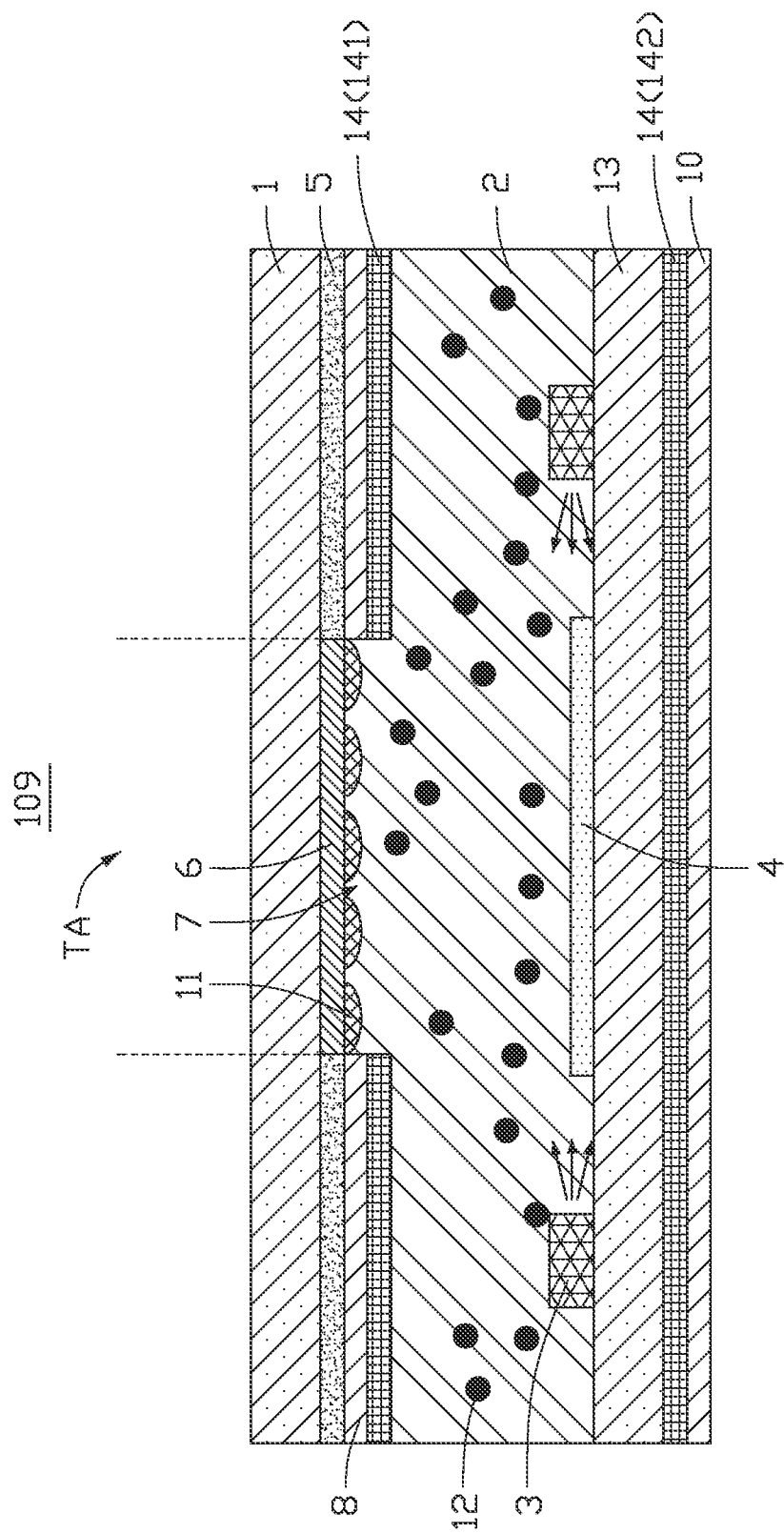
FIG. 11B is a cross-sectional view of a light-emitting assembly in FIG. 11A.

As shown in FIGS. 9B, 10B, and 11B, in modified embodiments according to the eighth to tenth embodiments, each of the light-emitting assemblies 107, 108, and 109 can further include two diffusion layers 14. One of the diffusion layers 14 (i.e., the upper diffusion layer 141) is on a side of the first reflective layer 8 away from the first substrate 1 and the other of the diffusion layers 14 (i.e., the lower diffusion layer 142) is on a side of the second reflective layer 10 adjacent to the light guide layer 2. Alternatively, in other modified embodiments according to the eighth to tenth embodiments, each of the light-emitting assemblies 107, 108, and 109 may include only one diffusion layer 14. The only one diffusion layer 14 is on a side of the first reflective layer 8 away from the first substrate 1 or is on a side of the second reflective layer 10 adjacent to the light guide layer 2. The diffusion layer 14 is beneficial to diffuse and homogenize light emitted by the light emitters 3.

The light-emitting assembly including the light guide layer 2, the first reflective layer 8, the second reflective layer 10, the array of light guide dots 11, and the diffusion layer 14 can effectively improve the uniformity and utilization of the light emitted by light emitters 3, thereby increasing the range of the light emitted by the light emitters 3 to the hole 6. The light emitted by the light emitters 3 completely covers and illuminates the function icon, as shown in FIG. 5.

In other modified embodiments according to the eighth embodiment to the tenth embodiment, the light-emitting assemblies 107, 108, and 109, the light emitters 3 are on a side of the light guide layer 2 adjacent to the first substrate 1, and the touch sensor 4 is on a side of the light guide layer 2 adjacent to the second substrate 13. Alternatively, the light emitters 3 are on a side of the light guide layer 2 adjacent to the second substrate 13, and the touch sensor 4 is on a side of the light guide layer 2 adjacent to the first substrate 1.

In one embodiment, each of the light-emitting assemblies 100 to 109 further includes a circuit board at least partially in the light guide layer 2. The light emitters 3 and the touch sensor 4 are on the circuit board. Electronic elements on the circuit board are not limited to the light emitters 3 and the touch sensor 4. The circuit board can be a printed circuit board (PCB).

In one embodiment, the light emitters 3 can be LEDs. Each LED can be a side-emitting LED or a front-emitting LED. The number and distribution of the light emitters 3 are not limited to FIGS. 1A through 4B and FIGS. 6A through 11B, which can be adjusted according to the actual needs.

In other embodiments, the first substrate 1 defines a light-transmitting area TA, the opening 7 is aligned with the light-transmitting area TA, and the touch sensor 4 faces the light-transmitting area TA. The array of light guide dots 11 is opposite to the light-transmitting area TA. The light-transmitting area TA of the first substrate 1 is made of transparent material, and other areas of the first substrate 1 are made of opaque material. The light-shielding layer 5 is omitted. The light-transmitting area TA can allow the light emitted by the light emitters 3 to pass through.

In other embodiments, the first reflective layer 8, the second reflective layer 10, the array of light guide dots 11, the diffusion particles 12, and the diffusion layer 14 can be used in combination in other ways.

Figure 12:
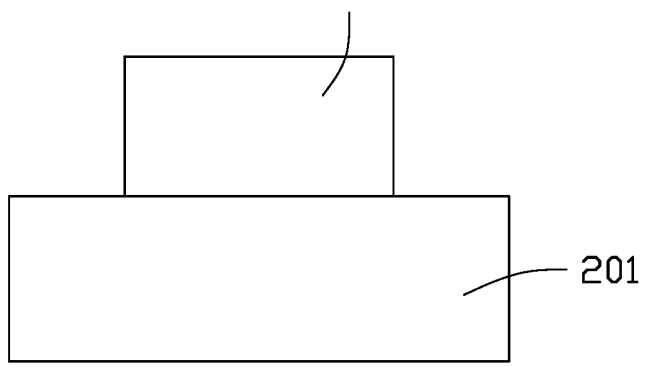
FIG. 12 is a flowchart of a method for making a light-emitting assembly according to an embodiment of the present disclosure.

FIG. 12 shows a flowchart of a method for making a light-emitting assembly according to an embodiment. The example method is provided by way of example, as there are a variety of ways to carry out the method. The method described below can be carried out using the configurations illustrated in FIGS. 1A through 4B and FIGS. 6A through 11B, for example, and various elements of these figures are referenced in explaining the example method. Each block shown in FIG. 12 represents one or more processes, methods, or subroutines carried out in the example method. Furthermore, the illustrated order of blocks is by example only, and the order of the blocks can be changed. Additional blocks can be added, or fewer blocks can be utilized, without departing from this disclosure. The example method can begin at block 51.

Block 51: a first substrate is provided.

Block S2: a light-shielding layer is formed on the first substrate.

In one embodiment, Block S2 includes printing opaque ink on the first substrate 1 to form the light-shielding layer. The opaque ink defines a hole 6. The Block S2 further includes printing transparent ink in the first substrate 1 and in the hole 6.

Block S3: a first reflective layer on a side of the first substrate is formed.

In one embodiment, the Block S3 includes spraying a reflective material on a side of the light-shielding layer 5 away from the first substrate 1 to form a first reflective layer 8. The first reflective layer 8 defines an opening 7. The opening 7 is aligned with and in communicating with the hole 6.

Block S4: a plurality of light emitters on a side of the first reflective layer away from the first substrate is formed.

In one embodiment, the light emitters 3 are formed by surface mount technology (SMT).

Block S5: a light guide layer covering the first reflective layer and the light emitters 3 is formed.

Block S6: a second reflective layer on a side of the light guide layer away from the first substrate is formed.

In one embodiment, after the opening 7 is formed, a light guide ink is printed on the first substrate 1 and in the opening 7 to form an array of light guide dots 11.

In one embodiment, the first substrate 1 defines a light-transmitting area TA. The light-transmitting area TA of the first substrate 1 is made of light-transmitting materials, and other areas of the first substrate 1 are made of opaque materials, the step of forming the light-shielding layer is omitted, the opening 7 is aligned with the light-transmitting area TA.

Figure 13:
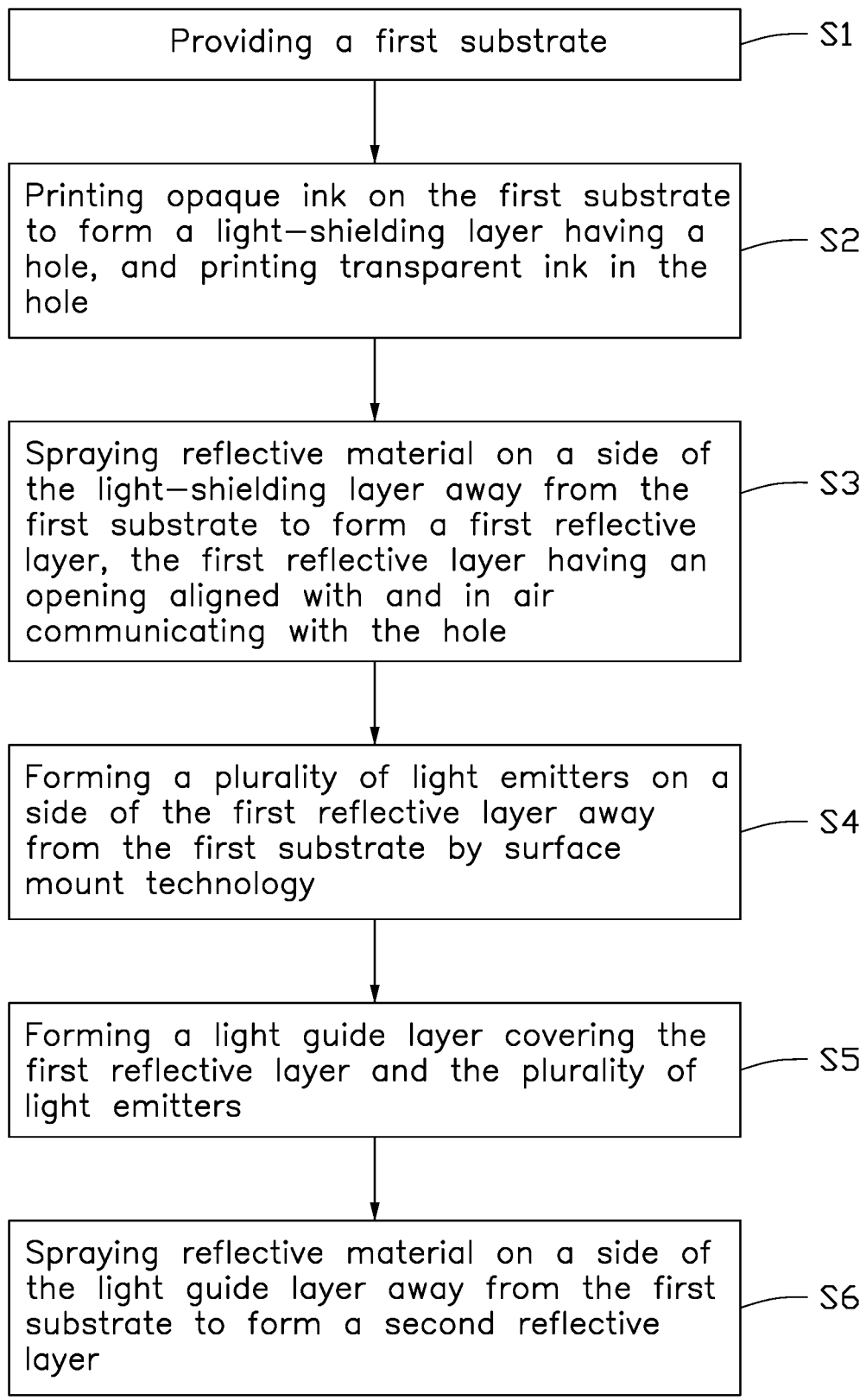
FIG. 13 is a structural diagram of an electronic device using the light-emitting assembly according to an embodiment of the present disclosure.

FIG. 13 shows an electronic device 200. The electronic device 200 includes a main body 201 and the light-emitting assembly 100 (or 101, 102, 103, 104, 105, 106, 107 or 108) on the main body 201.

The electronic device 200 may be an electronic terminal device, a vehicle, a refrigerator, a vehicle electronic device, a vehicle dashboard, a vehicle exterior, a vehicle interior panel, a vehicle door panels, lighting devices, furniture, architectural or decorative elements, measuring devices, computer devices, smart clothing (e.g., shirts, jackets or pants), other wearable electronic devices (e.g., wristband devices, headwear or footwear), multimedia devices, industrial machinery, controller devices, personal communication devices (e.g., smart phones or tablet computers), or other electronic devices.

What is claimed is:

1. A light-emitting assembly, comprising:
a first substrate having a first surface configured for receiving touches, the first substrate having a light-transmitting area which transmits light;
a light guide layer on a side of the first substrate away from the first surface;
a first reflective layer between the first substrate and the light guide layer, an opening being formed in the first reflective layer, and a boundary of a projection of the opening on the first substrate in a thickness direction of the light-emitting assembly coinciding with a boundary of the light-transmitting area of the first substrate;
a plurality of light emitters in the light guide layer, the plurality of light emitters being configured to project light to illuminate the light-transmitting area;
a touch sensor in the light guide layer, wherein in the thickness direction of the light-emitting assembly, a projection of the touch sensor on the first substrate at least partially overlaps with the light-transmitting area; and
a second reflective layer on a side of the light guide layer away from the first substrate.

2. The light-emitting assembly of claim 1, further comprising diffusion particles distributed in the light guide layer.

3. The light-emitting assembly of claim 1, further comprising a diffusion layer configured to diffuse and homogenize light emitted by the plurality of light emitters, wherein the diffusion layer is on a side of the first reflective layer away from the first substrate, or the diffusion layer is on a side of the second reflective layer adjacent to the light guide layer, or the diffusion layer is on a side of the first reflective layer away from the first substrate and on a side of the second reflective layer adjacent to the light guide layer.

4. The light-emitting assembly of claim 1, further comprising an array of light guide dots wherein in the thickness direction of the light-emitting assembly, a projection of the array of light guide dots on the first substrate at least partially overlaps with the light-transmitting area, and the array of light guide dots is configured to change a transmission direction of the light emitted by the plurality of light emitters in the light guide layer.

5. The light-emitting assembly of claim 4, wherein the array of light guide dots is between the first substrate and the light guide layer and in the opening, or the array of light guide dots is on a side of the second reflective layer adjacent to the light guide layer.

6. The light-emitting assembly of claim 1, further comprising an opaque light-shielding layer between the first substrate and the first reflective layer, wherein the light-shielding layer defines a hole, the hole is aligned with and in communicating with the opening to define a passage for the light emitted by the plurality of light emitters.

7. The light-emitting assembly of claim 1, further comprising a transparent insulating layer between the first reflective layer and the light guide layer, wherein a material of the first reflective layer is metal, the plurality of light emitters and the touch sensor are on the transparent insulating layer and covered by the light guide layer.

8. The light-emitting assembly of claim 1, further comprising a second substrate opposite to the first substrate and on a side of the light guide layer away from the first substrate, wherein the second reflective layer is on a side of the second substrate away from or adjacent to the first substrate.

9. The light-emitting assembly of claim 8, further comprising a transparent insulating layer between the light guide layer and the second reflective layer, wherein the second reflective layer is on a side of the second substrate adjacent to the first substrate, a material of the second reflective layer is metal, the plurality of light emitters and the touch sensor are on the transparent insulating layer and covered by the light guide layer.

10. The light-emitting assembly of claim 8, wherein the second reflective layer is on a side of the second substrate away from the first substrate, the second substrate is transparent, the plurality of light emitters and the touch sensor are on the second substrate, the light guide layer covers the second substrate, the plurality of light emitters and the first reflective layer.

11. The light-emitting assembly of claim 8, wherein the plurality of light emitters is on a side of the light guide layer adjacent to the first substrate, and the touch sensor is on a side of the light guide layer adjacent to the second substrate; or the plurality of light emitters is on a side of the light guide layer adjacent to the second substrate, and the touch sensor is on a side of the light guide layer adjacent to the first substrate.

* * * * *